United States Patent
Nakayamada

(10) Patent No.: US 12,229,687 B2
(45) Date of Patent: Feb. 18, 2025

(54) INFORMATION PROCESSING APPARATUS, INFORMATION PROCESSING METHOD, AND INFORMATION PROCESSING PROGRAM

(71) Applicant: NEC Corporation, Tokyo (JP)

(72) Inventor: Jun Nakayamada, Tokyo (JP)

(73) Assignee: NEC CORPORATION, Tokyo (JP)

( * ) Notice: Subject to any disclaimer, the term of this patent is extended or adjusted under 35 U.S.C. 154(b) by 1054 days.

(21) Appl. No.: 17/265,334

(22) PCT Filed: Sep. 14, 2018

(86) PCT No.: PCT/JP2018/034165
§ 371 (c)(1),
(2) Date: Feb. 2, 2021

(87) PCT Pub. No.: WO2020/026460
PCT Pub. Date: Feb. 6, 2020

(65) Prior Publication Data
US 2021/0316757 A1    Oct. 14, 2021

(30) Foreign Application Priority Data
Aug. 3, 2018   (JP) ................. 2018-146728

(51) Int. Cl.
*G06N 5/00* (2023.01)
*G06F 30/15* (2020.01)
(Continued)

(52) U.S. Cl.
CPC .............. *G06N 5/00* (2013.01); *G06F 30/15* (2020.01); *G06F 30/27* (2020.01); *B60W 2050/0075* (2013.01); *B60W 2520/06* (2013.01)

(58) Field of Classification Search
CPC .......... G06N 5/00; G06F 30/15; G06F 30/27; B60W 2050/0075; B60W 2520/06;
(Continued)

(56) References Cited

U.S. PATENT DOCUMENTS 10,816,978 B1 * 10/2020 Schwalb ................ G08G 1/012
11,354,458 B1 *  6/2022 Schwalb ................ G06N 3/006
(Continued)

FOREIGN PATENT DOCUMENTS

CN         108267322 A      7/2018
JP        2002-203108 A     7/2002
(Continued)

OTHER PUBLICATIONS

International Search Report for PCT Application No. PCT/JP2018/034165, mailed on Dec. 18, 2018.
(Continued)

*Primary Examiner* — Yi-Kai Wang
(74) *Attorney, Agent, or Firm* — Sughrue Mion, PLLC

(57) ABSTRACT

This invention is directed to an information processing apparatus that efficiently evaluates artificial intelligence for performing virtual automated driving of a virtual vehicle. This information processing apparatus comprises a generator that generates, from driving environment information generated by a driving environment simulator that simulates a virtual driving environment of a virtual vehicle, driving environment information representing a driving environment in which the virtual vehicle is readily put in a dangerous state and to be provided to artificial intelligence for performing automated driving of the virtual vehicle, an acquirer that acquires a virtual driving result obtained by performing the virtual automated driving of the virtual vehicle by the artificial intelligence in the virtual driving environment, and an evaluator that evaluates performance of the artificial intelligence from the virtual driving result of the virtual automated driving by the artificial intelligence.

16 Claims, 28 Drawing Sheets

(51) Int. Cl.
  *G06F 30/27* (2020.01)
  *B60W 50/00* (2006.01)
(58) Field of Classification Search
  CPC ............. B60W 50/04; B60W 60/0013; B60W 60/0015; B60W 40/10; G01M 17/007; G08G 1/00
  USPC .......................................................... 703/8
  See application file for complete search history.

(56) References Cited

U.S. PATENT DOCUMENTS

2018/0308281 A1   10/2018  Okoyama
2019/0019087 A1*  1/2019  Fukui .................. G06V 20/593

FOREIGN PATENT DOCUMENTS

| | | |
|---|---|---|
| JP | 2012-146251 A | 8/2012 |
| JP | 2015-028725 A | 2/2015 |
| JP | 2017-125768 A | 7/2017 |
| JP | 2018-054850 A | 4/2018 |
| WO | 2017/012677 A1 | 1/2017 |
| WO | 2017/163538 A1 | 9/2017 |
| WO | 2017/171005 A1 | 10/2017 |

OTHER PUBLICATIONS

Japanese Office Action for JP Application No. 2020-534037, mailed on Oct. 25, 2022 with English Translation.

* cited by examiner

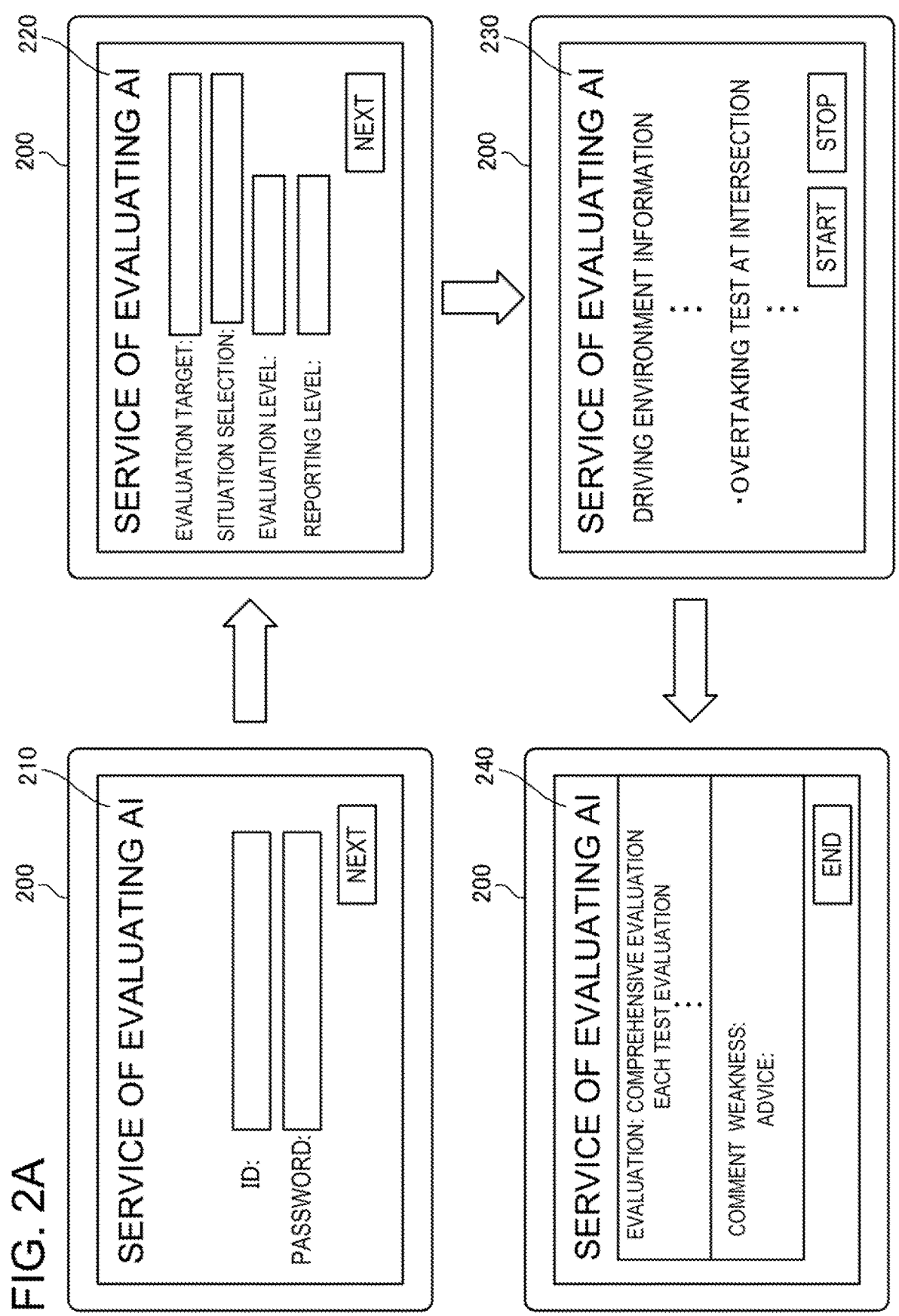

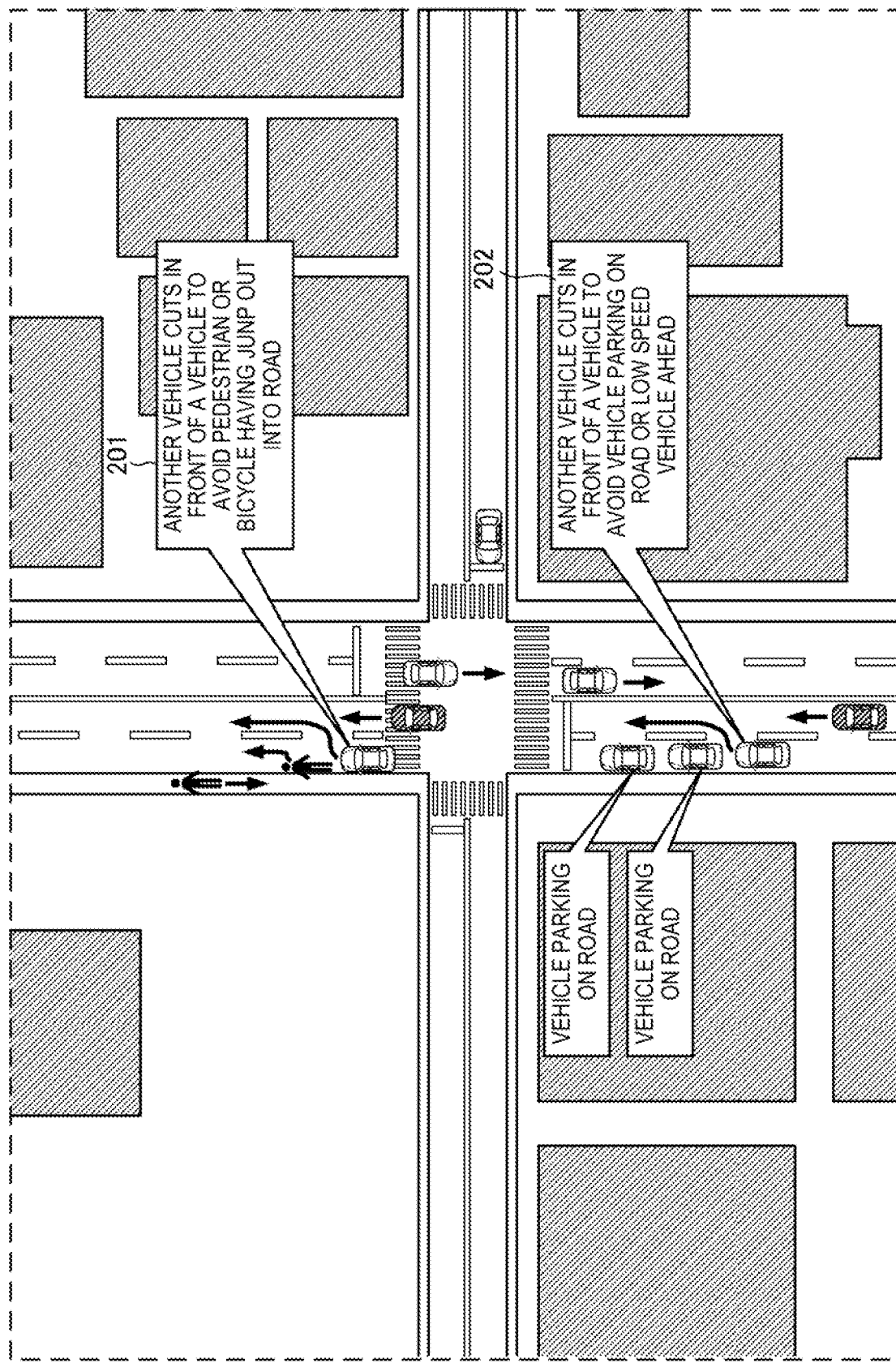

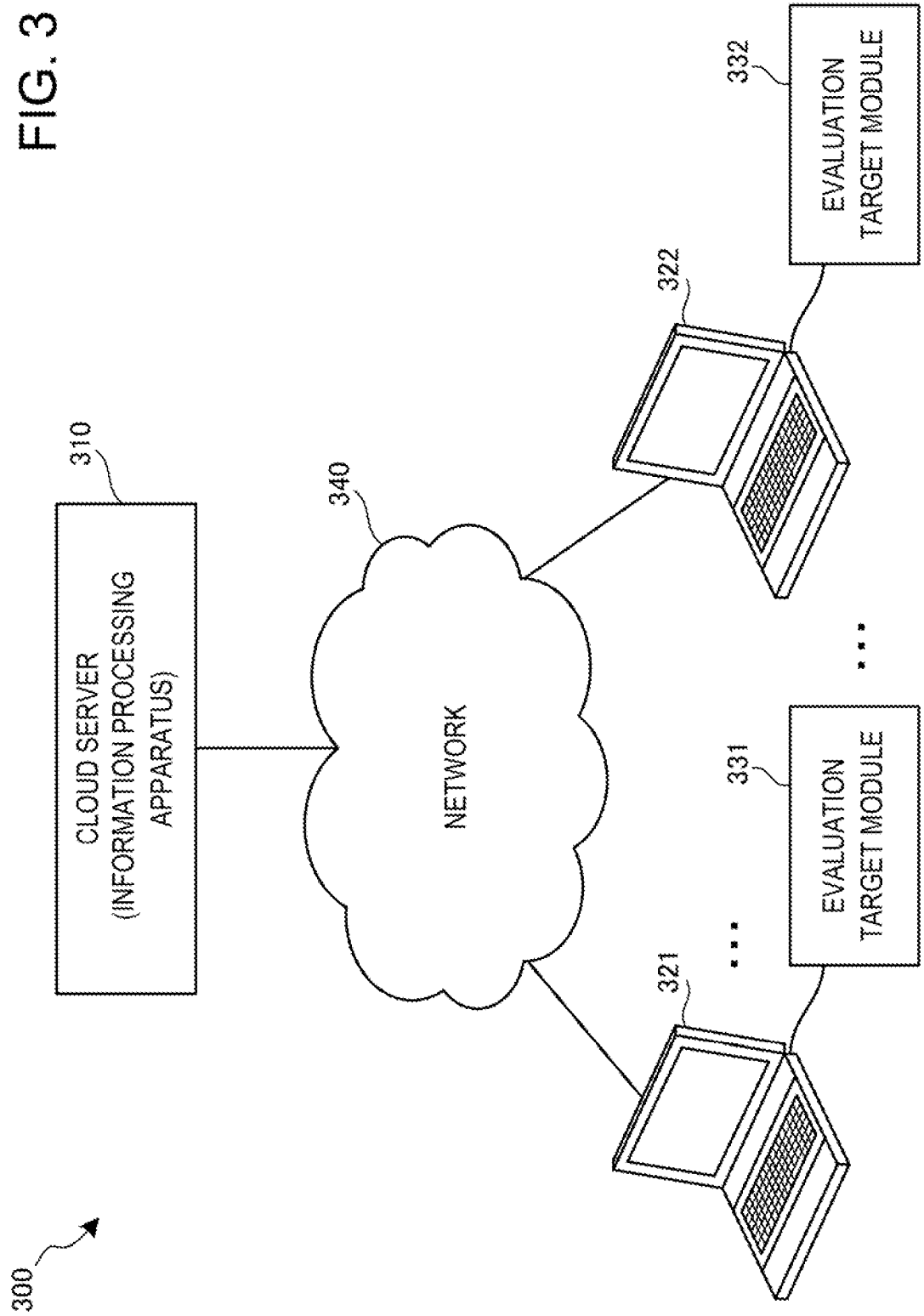

| 507 ↗ | | | | | |
|---|---|---|---|---|---|
| EVALUATION INFORMATION ID (801) | EVALUATION INFORMATION (802) | | | | EVALUATION CONDITION (THRESHOLD AND THE LIKE) (803) |
| | BRAKE OPERATION | ACCELERATION OPERATION | STEERING WHEEL OPERATION | ... | |
| | | | | | |
| | | | | | |
| | | | | | |
| ... | | | | | |

FIG. 8

| 1303 → | DRIVING ENVIRONMENT INFORMATION ID (601) | EVALUATION TARGET (602) | DRIVING ENVIRONMENT INFORMATION (603) | | | | EVALUATION INFORMATION ID (604) | DANGER RANK (1405) |
|---|---|---|---|---|---|---|---|---|
| | | | VIDEO DATA | MAP DATA | OBSTACLE DATA | TRAFFIC SIGNAL DATA | ... | | |
| | | WHOLE ECU | | | | | | |
| | | COLLISION SAFETY MODULE | | | | | | |
| | | DRIVE PLANNING MODULE | | | | | | |
| | ... | | | | | | | |

FIG. 14

| COMPREHENSIVE EVALUATION AXIS 1811 | INDIVIDUAL EVALUATION AXIS 1812 | EVALUATION INDEX (AXIS) ID 1813 |
|---|---|---|
| SAFETY | DANGER STATE | |
| | ACCIDENT | |
| | ⋮ | |
| STABILITY | SPEED VARIATION | |
| | LINEARITY | |
| | HOW TO TURN VEHICLE | |
| | ⋮ | |
| ⋮ | | |

| 1707 → | | | | | | |
|---|---|---|---|---|---|---|
| 801 | 1912 Evaluation information of first evaluation axis | | | 1913 Evaluation information of nTH evaluation axis | | 803 |
| Evaluation information ID | Brake operation | Acceleration operation | ... | Steering wheel operation | Brake operation | Acceleration operation | ... | Steering wheel operation | Evaluation condition (threshold and the like) |
| | | | | | | | | | |
| | | | | | | | | | |
| | | | | | | | | | |
| ... | | | | | | | | | |

FIG. 19

INFORMATION PROCESSING APPARATUS, INFORMATION PROCESSING METHOD, AND INFORMATION PROCESSING PROGRAM

This application is a National Stage Entry of PCT/JP2018/034165 filed on Sep. 14, 2018, which claims priority from Japanese Patent Application 2018-146728 filed on Aug. 3, 2018, the contents of all of which are incorporated herein by reference, in their entirety.

TECHNICAL FIELD

The present invention relates to an information processing apparatus, an information processing method, and an information processing program.

BACKGROUND ART

In the above technical field, patent literature 1 discloses a technique of evaluating virtual vehicle performance using a simulation.

CITATION LIST

Patent Literature

Patent literature 1: Japanese Patent Laid-Open No. 2015-028725

SUMMARY OF THE INVENTION

Technical Problem

In the technique described in the above literature, however, it is impossible to efficiently evaluate artificial intelligence for performing virtual automated driving of a virtual vehicle.

The present invention provides a technique of solving the above-described problem.

Solution to Problem

One example aspect of the present invention provides an information processing apparatus comprising:
  a generator that generates, from driving environment information generated by a driving environment simulator that simulates virtual driving environments of a virtual vehicle, driving environment information representing a virtual driving environment in which the virtual vehicle is readily put in a dangerous state and to be provided to artificial intelligence for performing virtual automated driving of the virtual vehicle;
  an acquirer that acquires a virtual driving result obtained by performing the virtual automated driving of the virtual vehicle by the artificial intelligence in the virtual driving environment; and
  an evaluator that evaluates performance of the artificial intelligence from the virtual driving result of the virtual automated driving by the artificial intelligence.

Another example aspect of the present invention provides an information processing method comprising:
  generating, from driving environment information generated by a driving environment simulator that simulates virtual driving environments of a virtual vehicle, driving environment information representing a driving environment in which the virtual vehicle is readily put in a dangerous state and to be provided to artificial intelligence for performing virtual automated driving of the virtual vehicle;
  acquiring a virtual driving result obtained by performing the virtual automated driving of the virtual vehicle by the artificial intelligence in the virtual driving environment; and
  evaluating performance of the artificial intelligence from the virtual driving result of the virtual automated driving by the artificial intelligence.

Still other example aspect of the present invention provides an information processing program for causing a computer to execute a method, comprising:
  generating, from driving environment information generated by a driving environment simulator that simulates virtual driving environments of a virtual vehicle, driving environment information representing a driving environment in which the virtual vehicle is readily put in a dangerous state and to be provided to artificial intelligence for performing virtual automated driving of the virtual vehicle;
  acquiring a virtual driving result obtained by performing the virtual automated driving of the virtual vehicle by the artificial intelligence in the virtual driving environment; and
  evaluating performance of the artificial intelligence from the virtual driving result of the virtual automated driving by the artificial intelligence.

Advantageous Effects of Invention

According to the present invention, it is possible to efficiently evaluate artificial intelligence for performing virtual automated driving of a virtual vehicle.

BRIEF DESCRIPTION OF DRAWINGS

FIG. 2A is a view showing an overview of artificial intelligence evaluation according to the second example embodiment of the present invention;

FIG. 2B is a view showing examples of a situation of artificial intelligence evaluation according to the second example embodiment of the present invention;

FIG. 3 is a block diagram showing the arrangement of an information processing system including an information processing apparatus according to the second example embodiment of the present invention;

FIG. 8 is a table showing the structure of an evaluation information database according to the second example embodiment of the present invention;

FIG. 14 is a table showing the structure of a driving environment information database according to the third example embodiment of the present invention;

FIG. 18 is a table showing the structure of an evaluation index table according to the fourth example embodiment of the present invention;

FIG. 19 is a table showing the structure of an evaluation information database according to the fourth example embodiment of the present invention;

DESCRIPTION OF EXAMPLE EMBODIMENTS

Example embodiments of the present invention will now be described in detail with reference to the drawings. It should be noted that the relative arrangement of the components, the numerical expressions and numerical values set forth in these example embodiments do not limit the scope of the present invention unless it is specifically stated otherwise.

First Example Embodiment

An information processing apparatus 100 according to the first example embodiment of the present invention will be described with reference to FIG. 1.

The information processing apparatus 100 is an apparatus that evaluates artificial intelligence.

Figure 1:
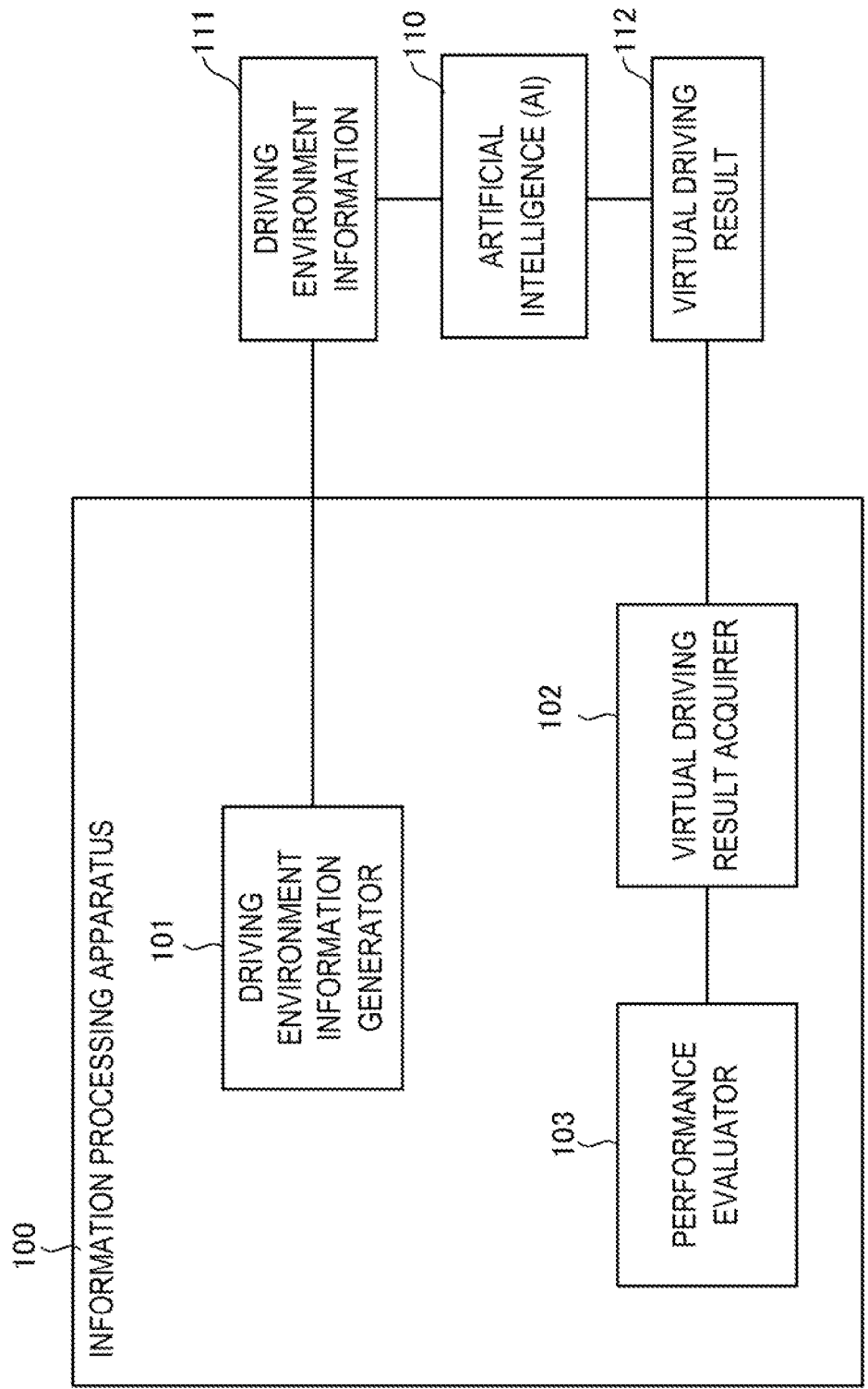
FIG. 1 is a block diagram showing the arrangement of an information processing apparatus according to the first example embodiment of the present invention.

As shown in FIG. 1, the information processing apparatus 100 includes a driving environment information generator 101, a virtual driving result acquirer 102, and a performance evaluator 103. The driving environment information generator 101 generates, from driving environment information generated by a driving environment simulator that simulates virtual driving environments of a virtual vehicle, driving environment information 111 representing a driving environment in which the virtual vehicle is readily put in a dangerous state and to be provided to artificial intelligence 110 for performing virtual automated driving of the virtual vehicle. The virtual driving result acquirer 102 acquires a virtual driving result 112 obtained by performing virtual automated driving of the virtual vehicle by the artificial intelligence 110 in the virtual driving environment. The performance evaluator 103 evaluates the performance of the artificial intelligence from the virtual driving result of the virtual automated driving by the artificial intelligence.

According to this example embodiment, since artificial intelligence is evaluated based on driving environment information representing a driving environment in which a virtual vehicle is readily put in a dangerous state, it is possible to efficiently evaluate the artificial intelligence for performing automated driving of the vehicle.

Second Example Embodiment

An information processing apparatus according to the second example embodiment of the present invention will be described next. The information processing apparatus according to this example embodiment provides, to artificial intelligence for performing virtual automated driving of a virtual vehicle, driving environment information representing a driving environment in which the virtual vehicle is readily put in a dangerous state among pieces of driving environment information generated by a driving environment simulator that simulates a virtual driving environment of the virtual vehicle, and evaluates a result of performing virtual automated driving of the virtual vehicle by the artificial intelligence. Furthermore, the information processing apparatus may provide driving environment information for evaluating a specific function included in the artificial intelligence, and evaluate the performance of the specific function.

The driving environment information includes video data of a front camera representing the virtual driving environment of the virtual vehicle. Note that the driving environment information representing the driving environment in which the virtual vehicle is readily put in the dangerous state includes driving environment information representing a status in which the virtual vehicle deviates from a normal driving rule. On the other hand, driving environment information representing a driving environment in which the possibility of the virtual vehicle putting in the dangerous state exceeds a threshold is not provided.

<Overview of Artificial Intelligence Evaluation>

FIG. 2A is a view showing an overview of artificial intelligence evaluation according to this example embodiment. FIG. 2A shows an overview of transition of display of a display unit 200 of a communication terminal in artificial intelligence evaluation according to this example embodiment.

A screen 210 is a screen when the communication terminal logs in to the information processing apparatus according to this example embodiment. A screen 220 is a screen for making a notification of an evaluation target of the information processing apparatus from the communication terminal. Note that an evaluation situation, an evaluation level, a reporting level, and the like may be set. If no evaluation situation is set, evaluation is executed based on random driving environment information.

A screen 230 is a screen for making a notification of a status while AI (Artificial Intelligence) processing is executed in accordance with the driving environment information. The screen 230 shows that "overtaking test at intersection" is currently executed. A screen 240 is a screen for making a notification of an evaluation result after the end of the test.

In this way, with a simple operation from the display unit 200 of the communication terminal, it is possible to obtain the evaluation result of the artificial intelligence.

Example of Situation of Artificial Intelligence Evaluation

FIG. 2B is a view showing examples of a situation of artificial intelligence evaluation according to this example embodiment.

A situation 201 shown in FIG. 2B represents a virtual driving environment "another vehicle cuts in front of a vehicle to avoid a pedestrian or bicycle having jump out into a road". A situation 202 shown in FIG. 2B represents a virtual driving environment "another vehicle cuts in front of a vehicle to avoid a vehicle parking on the road or a low speed vehicle ahead". Note that FIG. 2B shows merely an example, and many other situations in which a danger readily occurs can be generated. In this example embodiment, driving environment information representing the situation is provided to the AI to execute virtual driving in a virtual environment, thereby evaluating the result of the virtual driving.

<Arrangement of Information Processing System>

FIG. 3 is a block diagram showing the arrangement of an information processing system 300 including the information processing apparatus according to this example embodiment.

The information processing system 300 includes an information processing apparatus 310 serving as a cloud server of this example embodiment, and communication terminals 321 and 322 (corresponding to the communication terminal in FIG. 2A) each for requesting evaluation of evaluation target AI, all of which are connected by a network 340. Furthermore, the information processing system 300 includes evaluation target modules 331 and 332 of evaluation targets respectively connected to the communication terminals 321 and 322 each for requesting evaluation of evaluation target AI. Note that each of the evaluation target modules 331 and 332 may be a whole ECU (Electronic Control Unit/Engine Control Unit) or a control mechanism of some functions of the ECU. If for evaluation of software, the evaluation may be performed to the software in the communication terminal.

<<Operation Procedure of Information Processing System>>

Figure 4:
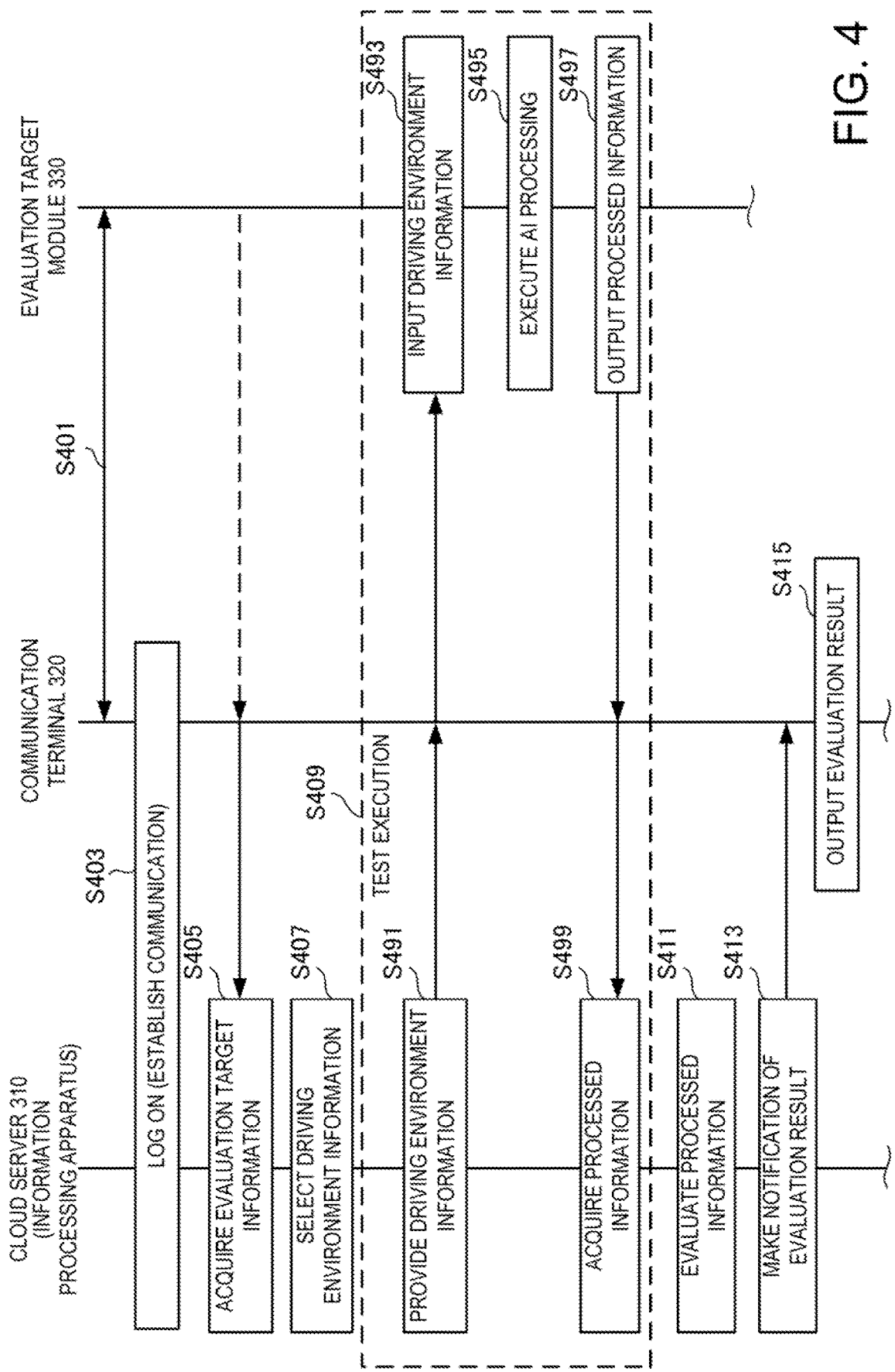
FIG. 4 is a sequence chart showing the operation procedure of the information processing system including the information processing apparatus according to the second example embodiment of the present invention.

FIG. 4 is a sequence chart showing the operation procedure of the information processing system 300 including the information processing apparatus according to this example embodiment.

In step S401, a communication terminal 320 that requests evaluation of AI and an evaluation target module 330 of an evaluation target are connected to each other. In step S403, the communication terminal 320 logs in to the information processing apparatus 310 serving as the cloud server of a request destination to establish communication, thereby activating an application.

In step S405, the information processing apparatus 310 acquires evaluation target information concerning the evaluation target. Note that the acquisition source may be the communication terminal 320 or the evaluation target module 330. In step S407, the information processing apparatus 310 selects driving environment information based on the evaluation target information. Note that if the evaluation target is the whole ECU, all the pieces of driving environment information are sequentially executed. On the other hand, if the evaluation target corresponds to some functions, driving environment information suitable for evaluation of the functions is selected.

In step S409, provision of the driving environment information, execution of AI processing, and acquisition of processed information are repeated between the information processing apparatus 310 and the evaluation target module 330 via the communication terminal 320 until evaluation ends. Step S409 includes provision of the driving environment information by the information processing apparatus 310 in step S491. Step S409 also includes input of the driving environment information to the evaluation target module 330 in step S493, execution of the AI processing by the evaluation target module 330 in step S495, and output of the processed information from the evaluation target module 330 in step S497. In addition, step S409 includes acquisition of the processed information by the information processing apparatus 310 in step S499.

In step S411, the information processing apparatus 310 evaluates the acquired processed information directly or calculates an evaluation index to evaluate the processed information. In step S413, the information processing apparatus 310 notifies the communication terminal 320 of an evaluation result. In step S415, the communication terminal 320 outputs the received evaluation result to the user.

<<Functional Arrangement of Information Processing Apparatus>>

Figure 5:
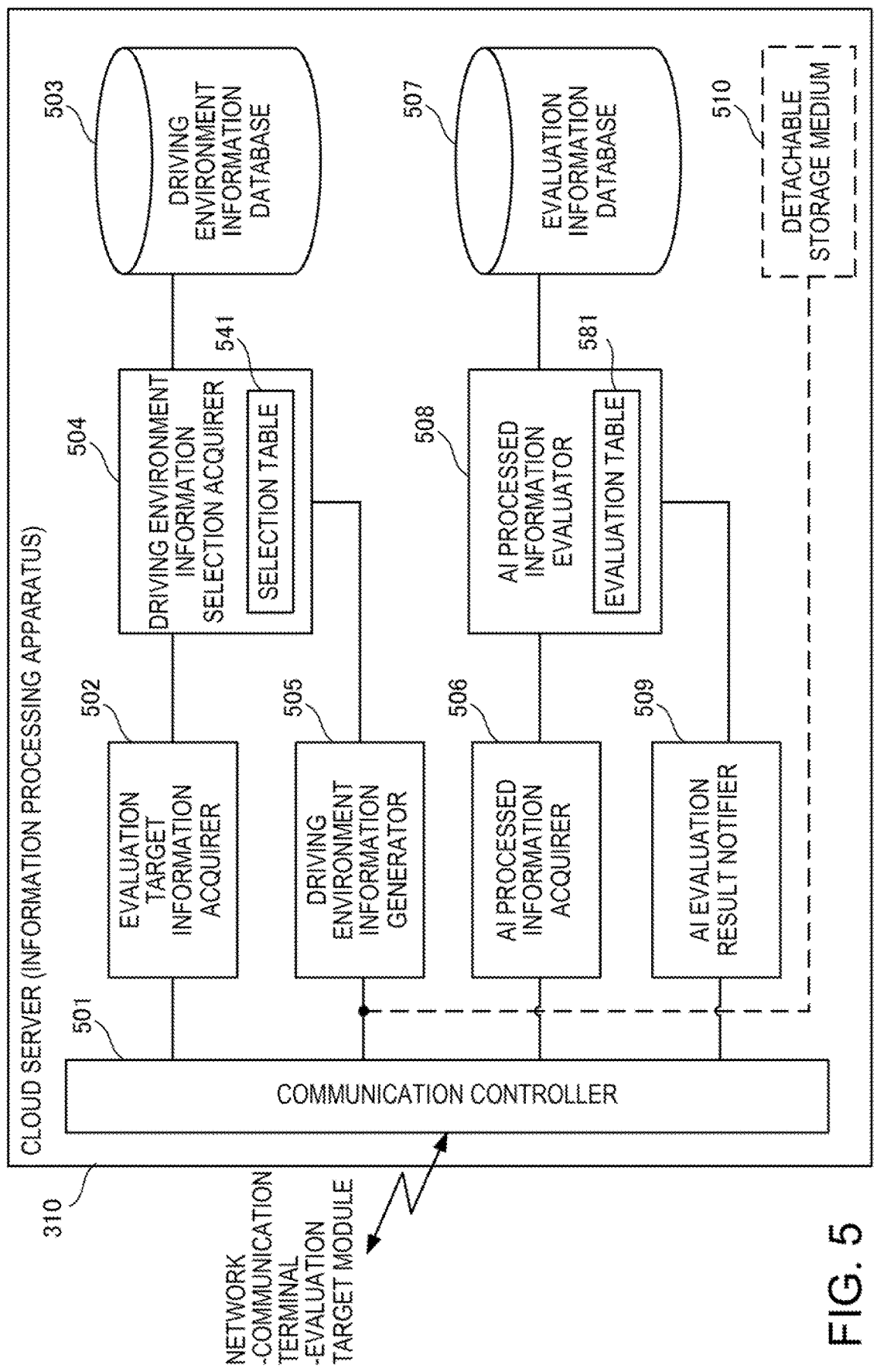
FIG. 5 is a block diagram showing the functional arrangement of the information processing apparatus serving as a cloud server according to the second example embodiment of the present invention.

FIG. 5 is a block diagram showing the functional arrangement of the information processing apparatus 310 serving as the cloud server according to this example embodiment.

The information processing apparatus 310 includes a communication controller 501, an evaluation target information acquirer 502, a driving environment information database 503, a driving environment information selection acquirer 504, and a driving environment information generator 505. Furthermore, the information processing apparatus 310 includes an AI processed information acquirer 506, an evaluation information database 507, an AI processed information evaluator 508, an AI evaluation result notifier 509, and an optional detachable storage medium 510.

The communication controller 501 controls communication with the communication terminal 320 via the network 340. The evaluation target information acquirer 502 acquires the evaluation target information of the evaluation target from the communication terminal 320. The driving environment information database 503 accumulates the driving environment information for testing the evaluation target module 330 via the communication terminal 320. The driving environment information selection acquirer 504 includes a selection table 541, and selects the driving environment information with reference to the evaluation target information and acquires it from the driving environment information database 503. The driving environment information generator 505 generates, from the selected and acquired driving environment information, driving environment information to be provided. Then, the generated driving environment information is provided to the evaluation target module 330 via the communication terminal 320 or the detachable storage medium 510.

The AI processed information acquirer 506 acquires the processed information of the evaluation target module 330 via the communication terminal 320. The evaluation information database 507 accumulates the evaluation information for evaluating the acquired processed information. The AI processed information evaluator 508 includes an evaluation table 581, and evaluates the AI processed information by comparing the AI processed information with the evaluation information in the evaluation information database 507. The AI evaluation result notifier 509 provides the evaluation result of the AI processed information to the communication terminal 320.

(Driving Environment Information Database)

Figure 6:
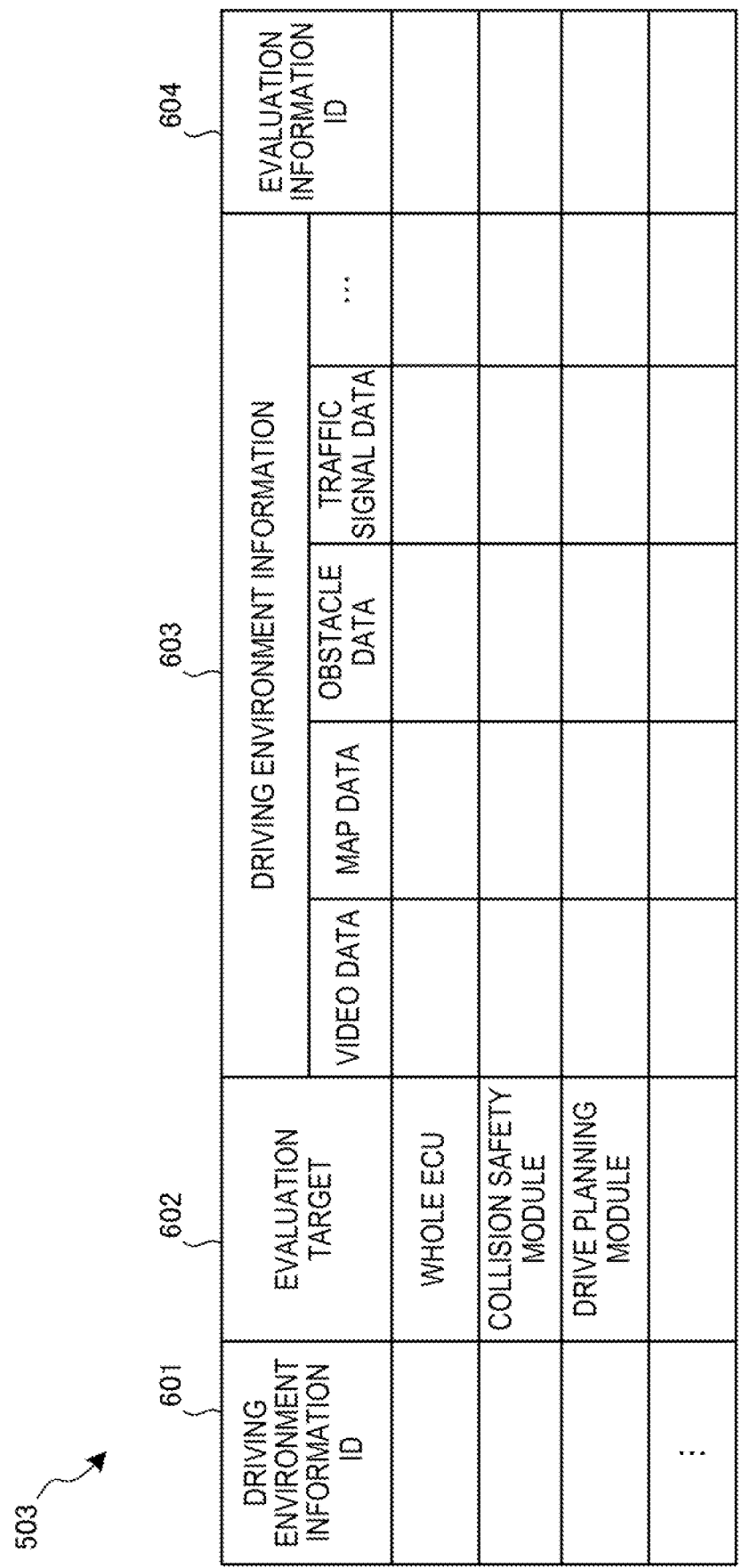
FIG. 6 is a table showing the structure of a driving environment information database according to the second example embodiment of the present invention.

FIG. 6 is a table showing the structure of the driving environment information database 503 according to this example embodiment. The driving environment information database 503 accumulates driving environment information for testing the evaluation target module 330.

The driving environment information database 503 stores an evaluation target 602, driving environment information 603, and an evaluation information ID 604 in association with a driving environment information ID 601. The evaluation target 602 stores information indicating whether the driving environment information is used to evaluate the whole ECU or some functions. In FIG. 6, a collision safety module and a drive planning module are described as some functions but the present invention is not limited to them.

The driving environment information 603 includes video data captured by the front camera of a virtual vehicle, map data for confirming the position of the self-virtual vehicle, obstacle data of a driving area, and traffic signal data. The evaluation information ID 604 indicates the ID of the evaluation information for evaluating the AI processing under the virtual driving environment.

(Driving Environment Information Selection Table)

Figure 7:
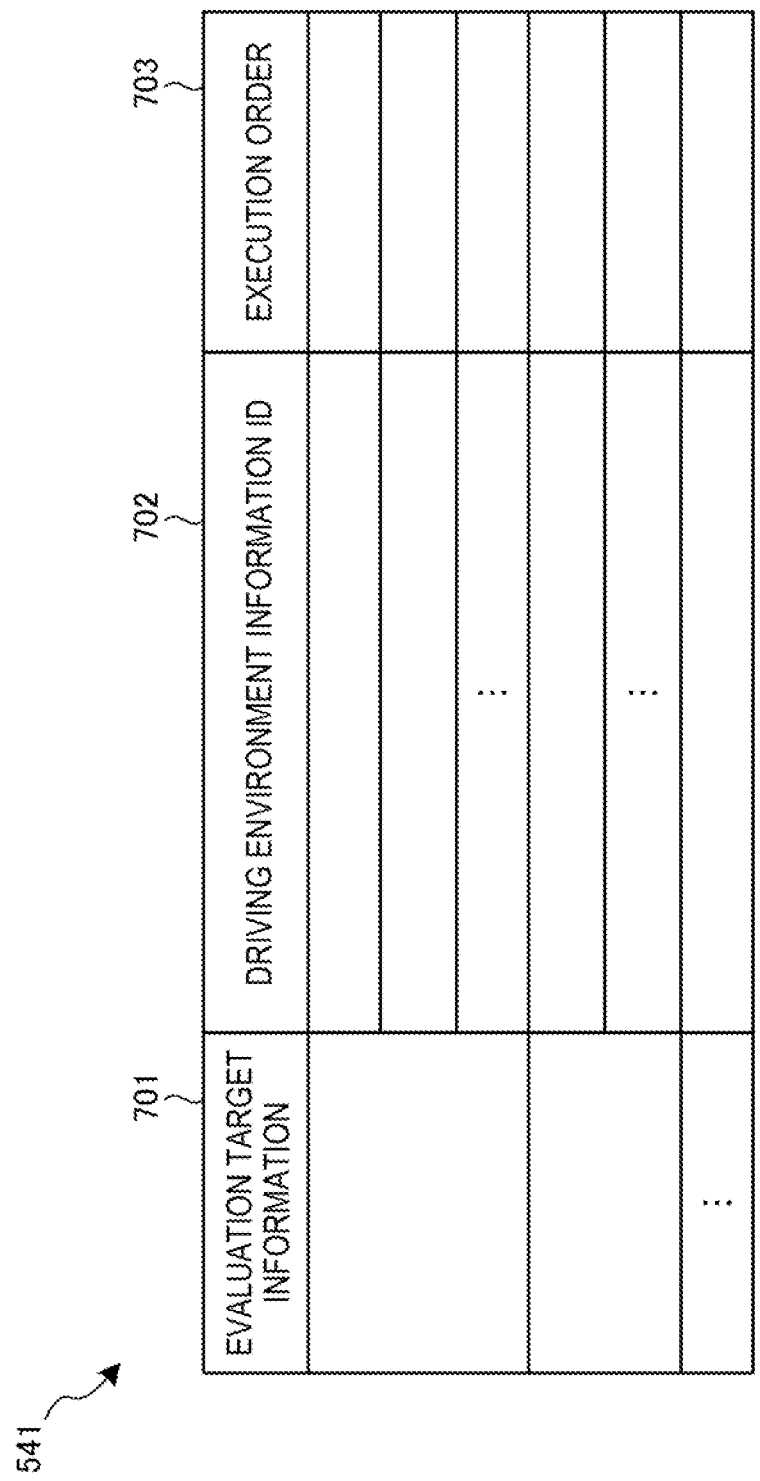
FIG. 7 is a table showing the structure of a driving environment information selection table according to the second example embodiment of the present invention.

FIG. 7 is a table showing the structure of the driving environment information selection table 541 according to this example embodiment. The driving environment information selection table 541 is used by the driving environment information selection acquirer 504 to select, based on the evaluation target information, driving environment information to be provided.

The driving environment information selection table 541 stores at least one driving environment information ID 702 in association with evaluation target information 701. Based on the driving environment information ID 702, driving environment information is selected and acquired from the driving environment information database 503. An execution order 703 stores an execution order when a plurality of driving environment information IDs 702 exist. This order is desirably determined so as to prioritize driving environment information representing virtual driving environments in which a virtual vehicle is readily put in a danger state.

(Evaluation Information Database)

FIG. 8 is a table showing the structure of the evaluation information database 507 according to this example embodiment. The evaluation information database 507 stores processing information for performing evaluation by comparison with the processing information of the AI processing.

The evaluation information database 507 stores evaluation information 802 and an evaluation condition 803 in association with an evaluation information ID 801. The evaluation information 802 includes, for example, a brake operation, an acceleration operation, and a steering wheel operation all of which are also output by the AI processing, but is not limited to them. The evaluation condition 803 includes, for example, presence or absence of the evaluation information 802 itself or a threshold for a calculation result of AI.

(Evaluation Table)

Figure 9:
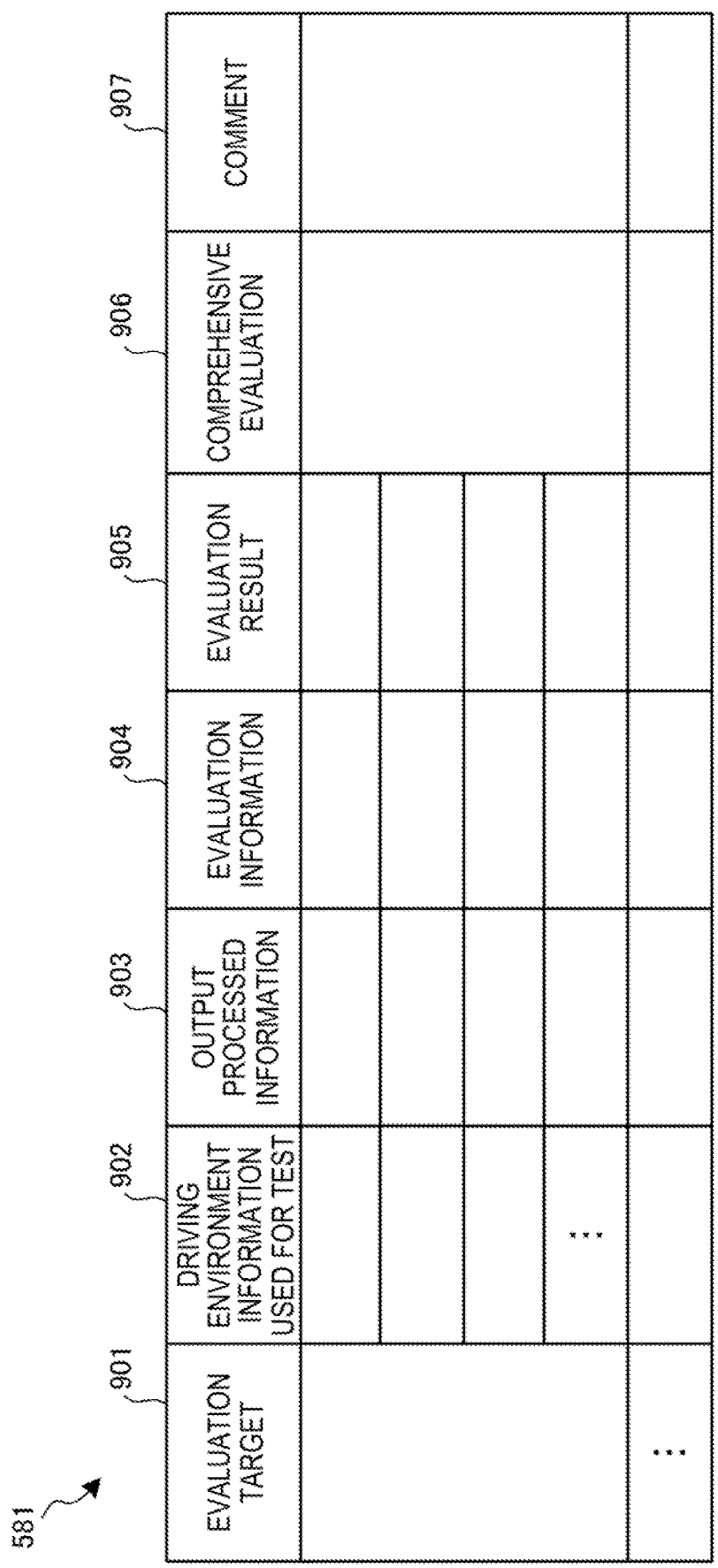
FIG. 9 is a table showing the structure of an evaluation table according to the second example embodiment of the present invention.

FIG. 9 is a table showing the structure of the evaluation table 581 according to this example embodiment. The evaluation table 581 is used by the AI processing information evaluator 508 to derive an evaluation result from the processing information of the AI processing and the evaluation information in the evaluation information database 507.

The evaluation table 581 stores at least one piece of driving environment information 902 used for a test in association with an evaluation target 901. Then, the evaluation table 581 stores processing information 903 output from the AI, evaluation information 904 obtained from the evaluation information database 507, and an evaluation result 905 in association with each piece of driving environment information 902. Furthermore, the evaluation table 581 stores a comprehensive evaluation 906 and a comment 907 to the user in association with the evaluation target 901.

<<Functional Arrangement of Communication Terminal>>

Figure 10:
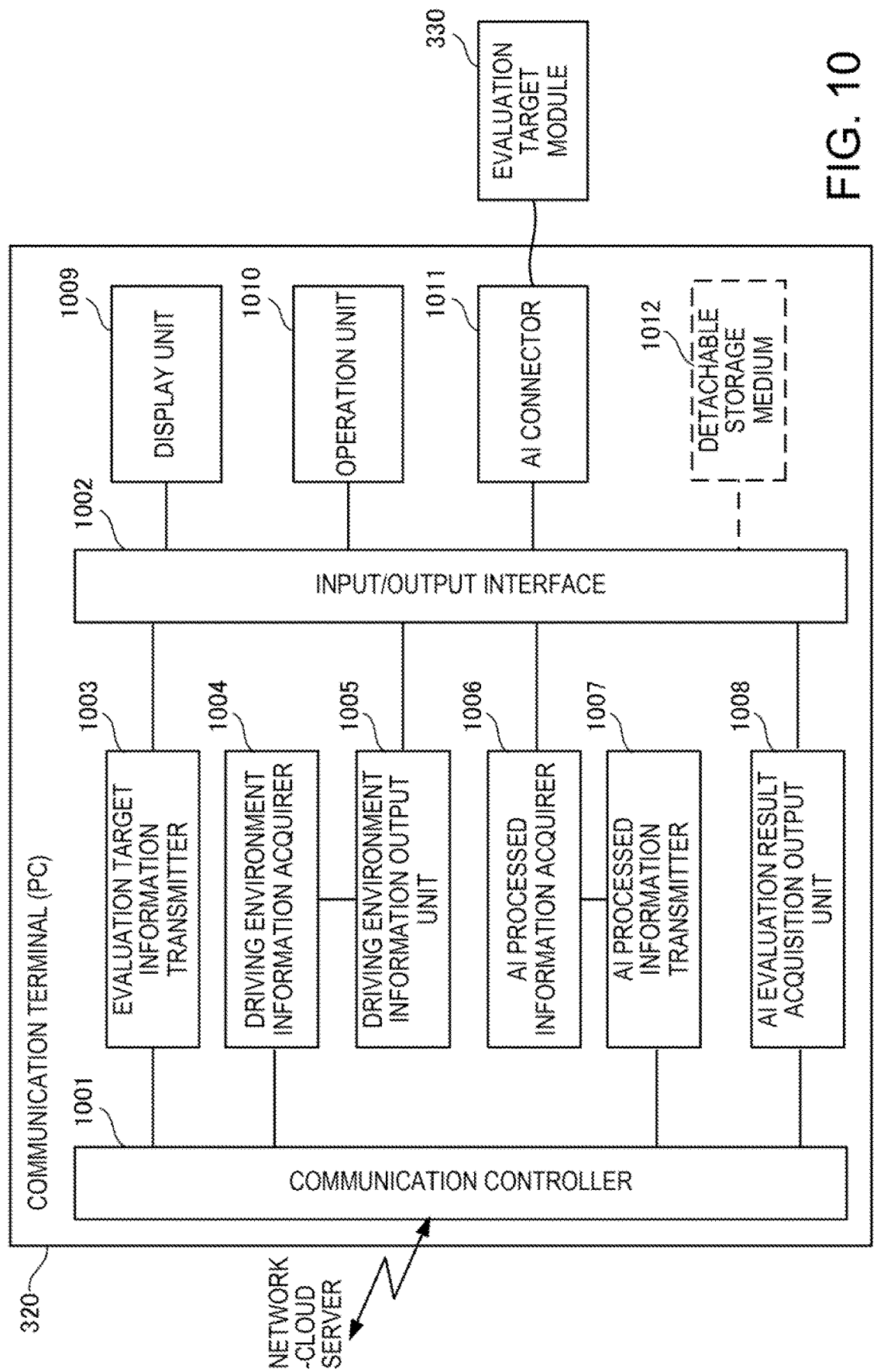
FIG. 10 is a block diagram showing the functional arrangement of a communication terminal according to the second example embodiment of the present invention.

FIG. 10 is a block diagram showing the functional arrangement of the communication terminal 320 according to this example embodiment.

The communication terminal 320 includes a communication controller 1001, an input/output interface 1002, an evaluation target information transmitter 1003, a driving environment information acquirer 1004, and a driving environment information output unit 1005. The communication terminal 320 also includes an AI processed information acquirer 1006, an AI processed information transmitter 1007, and an AI evaluation result acquisition output unit 1008. Furthermore, the communication terminal 320 includes a display unit 1009, an operation unit 1010, and an AI connector 1011 with the evaluation target module 330 connected, all of which are connected to the input/output interface 1002.

The communication controller 1001 controls communication with the information processing apparatus 310 via the network 340. The input/output interface 1002 interfaces the display unit 1009, the operation unit 1010, the AI connector 1011, and an optional detachable storage medium 1012.

The evaluation target information transmitter 1003 transmits, to the information processing apparatus 310, evaluation target information input from the operation unit 1010 or acquired from the evaluation target module 330. The driving environment information acquirer 1004 acquires the driving environment information associated with the evaluation target information from the information processing apparatus 310. The driving environment information output unit 1005 outputs the driving environment information from the AI connector 1011 to the evaluation target module 330.

The AI processed information acquirer 1006 acquires processed information of AI processing from the evaluation target module 330 via the AI connector 1011. The AI processed information transmitter 1007 transmits the acquired AI processed information to the information processing apparatus 310. The AI evaluation result acquisition output unit 1008 receives the evaluation result of the AI processed information from the information processing apparatus 310, and outputs the evaluation result to the display unit 1009 or the like.

The display unit 1009 displays the state of the communication terminal 320 and the AI evaluation result. The operation unit 1010 accepts an operation instruction of the communication terminal 320. The AI connector 1011 connects the evaluation target module 330. The detachable storage medium 1012 outputs the driving environment information, obtained from the information processing apparatus 310 serving as the cloud server, to the evaluation target module 330 via the driving environment information output unit 1005 and the AI connector 1011.

<<Hardware Arrangement of Information Processing Apparatus>>

Figure 11:
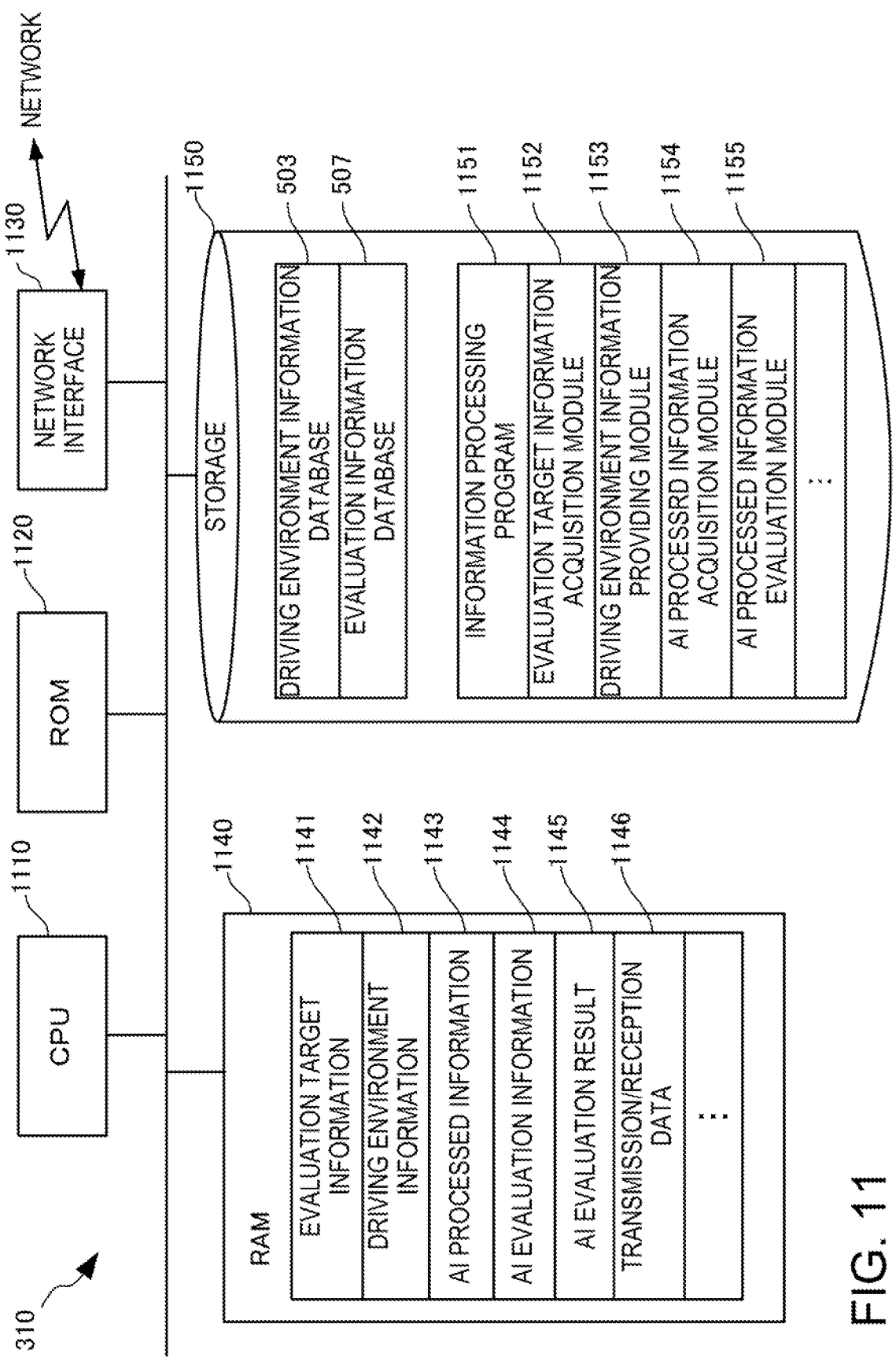
FIG. 11 is a block diagram showing the hardware arrangement of the information processing apparatus serving as the cloud server according to the second example embodiment of the present invention.

FIG. 11 is a block diagram showing the hardware arrangement of the information processing apparatus 310 serving as the cloud server according to this example embodiment.

In FIG. 11, a CPU (Central Processing Unit) 1110 is an arithmetic control processor, and implements the functional components shown in FIG. 5 by executing a program. One CPU 1110 or a plurality of CPUs 1110 may be included. A ROM (Read Only Memory) 1120 stores permanent data such as initial data and a program, and programs. A network interface 1130 controls communication with the communication terminal 320 via a network.

A RAM (Random Access Memory) 1140 is a random access memory used as a temporary storage work area by the CPU 1110. An area to store data necessary for implementation of this example embodiment is allocated to the RAM 1140. Evaluation target information 1141 is information indicating the evaluation target module received from the communication terminal 320. Driving environment information 1142 is driving environment information selected and acquired from the driving environment information database 503 in association with the evaluation target information 1141. AI processed information 1143 is processed information acquired by performing AI processing after providing the driving environment information 1142. AI evaluation information 1144 is evaluation information acquired from the evaluation information database 507 in association with the evaluation target information 1141. An AI evaluation result 1145 is an AI evaluation result derived by comparing the AI processing information 1143 and the AI evaluation information 1144 with each other. Transmission/reception data 1146 is data transmitted/received to/from the communication terminal 320 via the network interface 1130.

A storage 1150 stores a database, various parameters, or the following data or programs necessary for implementation of this example embodiment, to be used by the CPU 1110. The driving environment information database 503 is the database, shown in FIG. 6, that stores the driving environment information. The evaluation information database 507 is the database, shown in FIG. 8, that stores the evaluation information.

The storage 1150 stores the following programs. An information processing program 1151 is a program that controls the overall information processing apparatus 310. An evaluation target information acquisition module 1152 is a module that acquires the evaluation target information. A driving environment information providing module 1153 is a module that acquires the driving environment information associated with the evaluation target information and provides it to the evaluation target. An AI processed information acquisition module 1154 is a module that acquires the AI processed information from the evaluation target. An AI processed information evaluation module 1155 is a module that evaluates the AI processed information and notifies the user of an evaluation result via the communication terminal 320. Note that programs and data which are associated with the general-purpose functions of the information processing apparatus 310 serving as the cloud server and other feasible functions are not shown in the RAM 1140 or the storage 1150 of FIG. 11.

<<Processing Procedure of Information Processing Apparatus>>

Figure 12:
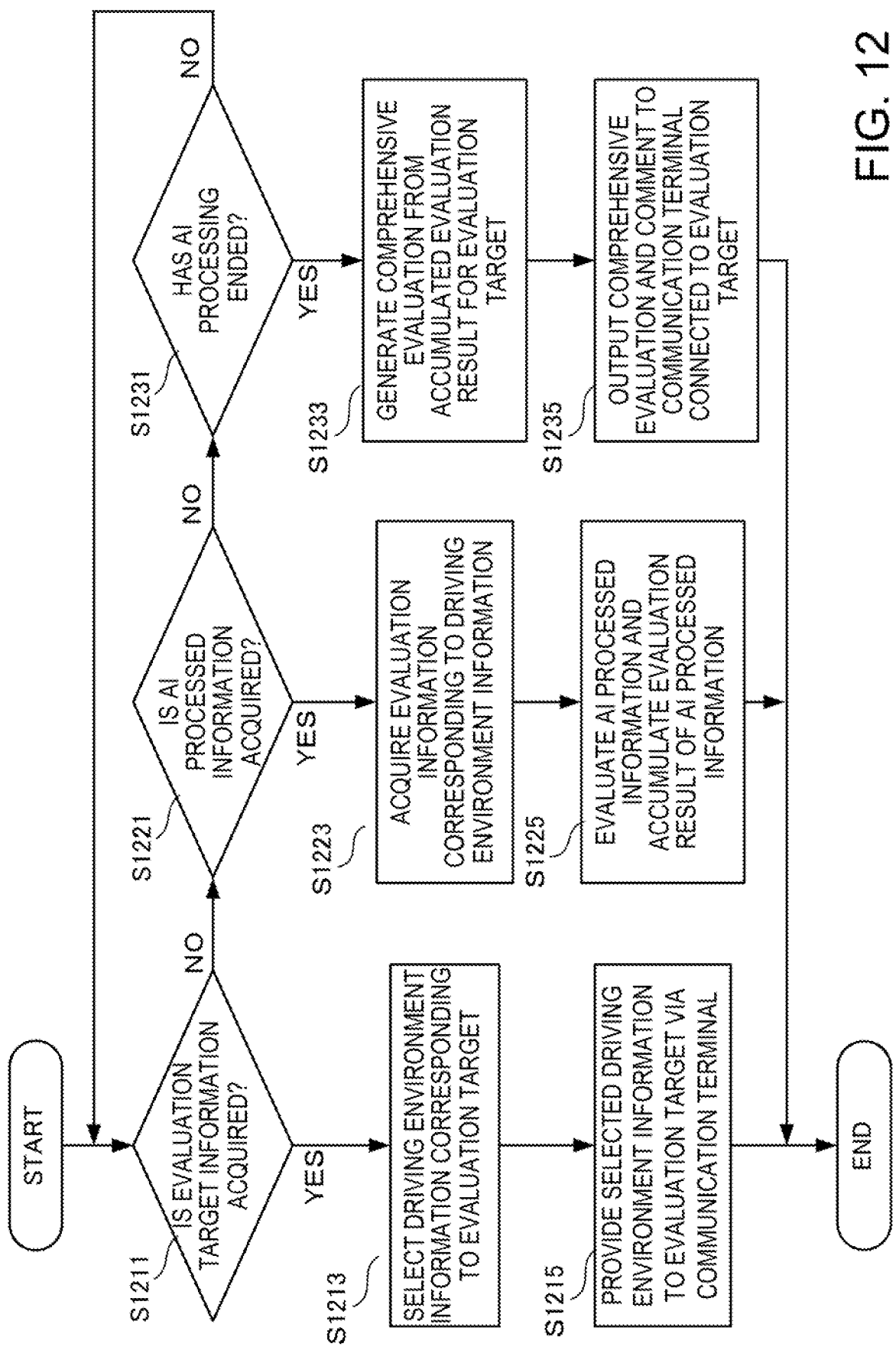
FIG. 12 is a flowchart illustrating the processing procedure of the information processing apparatus serving as the cloud server according to the second example embodiment of the present invention.

FIG. 12 is a flowchart illustrating the processing procedure of the information processing apparatus 310 serving as the cloud server according to this example embodiment. Note that this flowchart is executed by the CPU 1110 shown in FIG. 11 using the RAM 1140, thereby implementing the functional components shown in FIG. 5.

In step S1211, the information processing apparatus 310 determines whether evaluation target information is acquired. If it is determined that the evaluation target information is acquired, the information processing apparatus 310 selects, in step S1213, driving environment information corresponding to the acquired evaluation target information, and acquires it from the driving environment information database 503. Then, the information processing apparatus 310 provides the selected and acquired driving environment information to the evaluation target via the communication terminal 320.

If it is determined that no evaluation target information is acquired, the information processing apparatus 310 determines in step S1221 whether AI processed information is acquired. If it is determined that the AI processed information is acquired, the information processing apparatus 310 acquires, in step S1223, evaluation information corresponding to the driving environment information from the evaluation information database 507. Then, in step S1225, the information processing apparatus 310 evaluates the AI processed information using the evaluation information and accumulates the evaluation result of the AI processed information.

If it is determined that no evaluation target information is acquired and no AI processing information is acquired, the information processing apparatus 310 determines, in step S1231, whether the AI processing has ended. If it is determined that the AI processing has ended, the information processing apparatus 310 generates, in step S1233, a comprehensive evaluation from the accumulated evaluation result for the evaluation target. In step S1235, the information processing apparatus 310 outputs the comprehensive evaluation and a comment to the communication terminal connected to the evaluation target.

According to this example embodiment, since artificial intelligence is evaluated based on driving environment information representing a virtual driving environment in which a virtual vehicle is readily put in a dangerous state, it is possible to efficiently evaluate the artificial intelligence for performing automated driving of the vehicle. Furthermore, it is possible to select an evaluation target from a large module to a small module, thereby implementing flexible evaluation of AI.

Third Example Embodiment

An information processing apparatus according to the third example embodiment of the present invention will be described next. The information processing apparatus according to this example embodiment is different from that according to the above-described second example embodiment in that evaluation is performed by assigning priority levels to pieces of driving environment information in the order from driving environment information representing a virtual driving environment in which a virtual vehicle is readily put in a dangerous state to driving environment information representing a virtual driving environment in which the virtual vehicle is hardly put in the dangerous state. The remaining components and operations are similar to those in the second example embodiment. Hence, the same reference numerals denote similar components and operations, and a detailed description thereof will be omitted.
<<Functional Arrangement of Information Processing Apparatus>>

Figure 13:
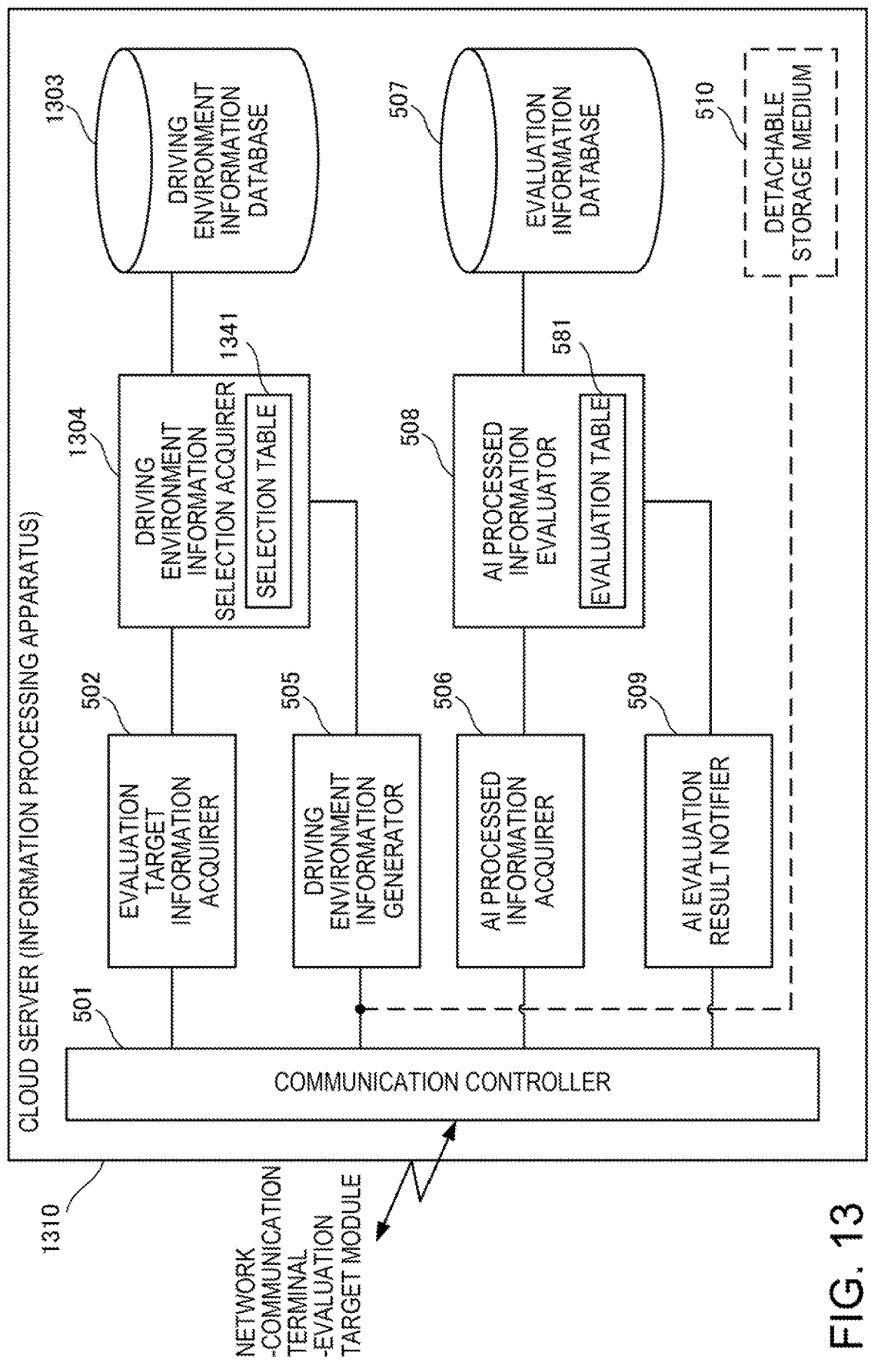
FIG. 13 is a block diagram showing the functional arrangement of an information processing apparatus serving as a cloud server according to the third example embodiment of the present invention.

FIG. 13 is a block diagram showing the functional arrangement of an information processing apparatus 1310 serving as a cloud server according to this example embodiment. Note that in FIG. 13, the same reference numerals as in FIG. 5 denote similar components and a repetitive description thereof will be omitted.

The information processing apparatus 1310 shown in FIG. 13 includes a driving environment information database 1303, and a driving environment information selection acquirer 1304 including a selection table 1341. The driving environment information database 1303 holds the degree of danger of each piece of driving environment information. Note that the driving environment information selection acquirer 1304 and the selection table 1341 are changed since the driving environment information database 1303 is changed. However, functions of the driving environment information selection acquirer 1304 and the selection table 1341 are not essentially changed, and therefore, a description thereof will be omitted.
(Driving Environment Information Database)

FIG. 14 is a table showing the structure of the driving environment information database 1303 according to this example embodiment. Note that in FIG. 14, the same reference numerals as in FIG. 6 denote similar components and a repetitive description thereof will be omitted.

The driving environment information database 1303 stores a danger rank 1405 for each piece of driving environment information. The driving environment information selection acquirer 1304 selects and acquires driving environment information to be provided in consideration of also the danger rank 1405. In general, it is desirable to select and acquire the driving environment information in descending order of the danger rank 1405, but the present invention is not limited to this. Note that the danger rank 1405 stores a danger level, and a danger rank may be assigned according to the danger level at the time of acquiring the danger rank.
<<Processing Procedure of Information Processing Apparatus>>

Figure 15:
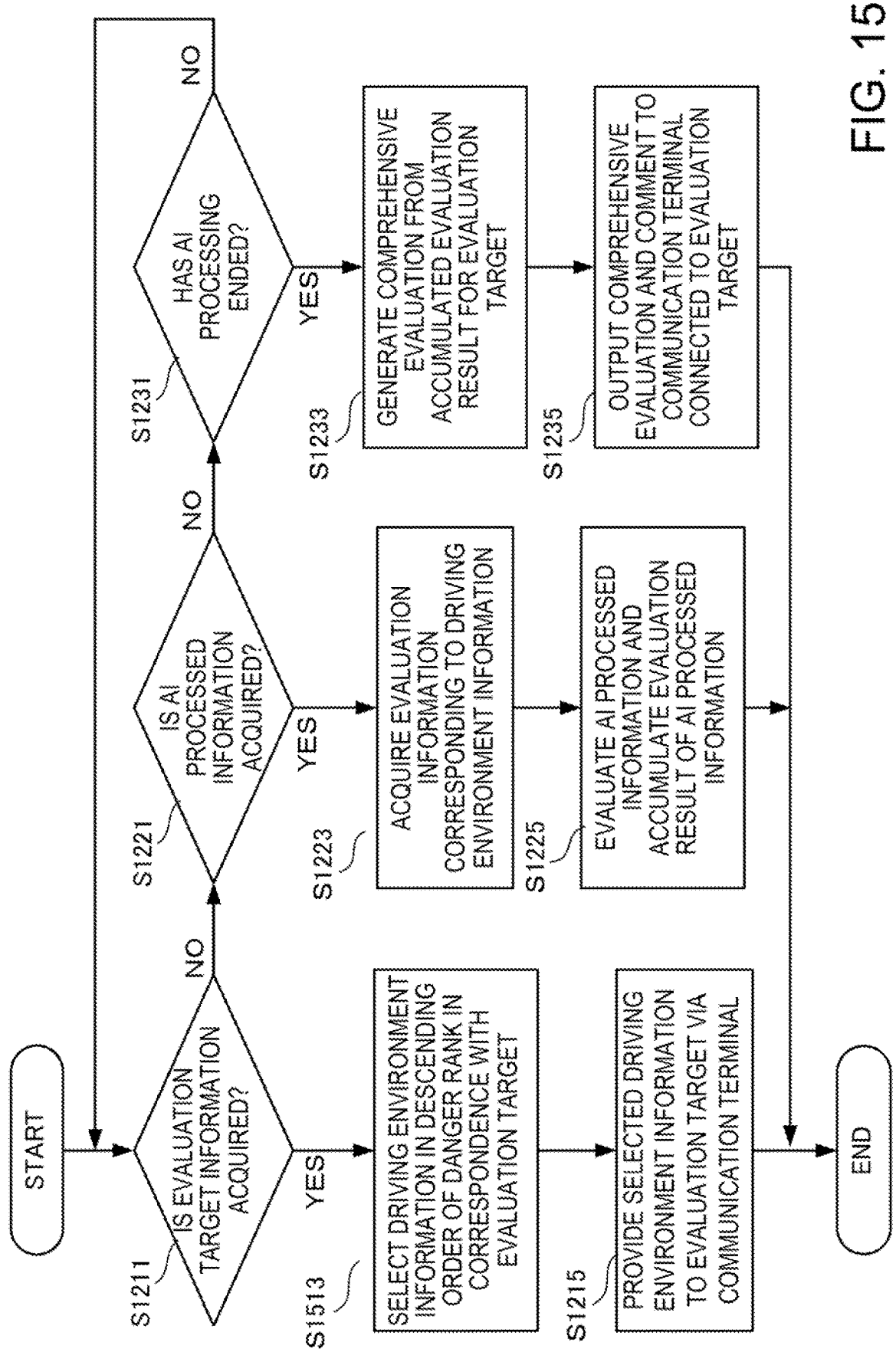
FIG. 15 is a flowchart illustrating the processing procedure of the information processing apparatus serving as the cloud server according to the third example embodiment of the present invention.

FIG. 15 is a flowchart illustrating the processing procedure of the information processing apparatus 1310 serving as the cloud server according to this example embodiment. Note that in FIG. 15, the same step numbers as in FIG. 12 denote the same steps and a repetitive description thereof will be omitted.

In step S1513, the information processing apparatus 1310 selects driving environment information, for example, in descending order of the danger rank in correspondence with an evaluation target.

Note that in this example embodiment, the priority order may be selected, for example, from a high-speed environment to a low-speed environment, from a heavy-rain environment to a light-rain environment, from a road in the center of a city to a country road, from a thin-lane-line environment to a dark-lane-line environment, from a sharp-curve environment to a gentle-curve environment, or from the front of backlight to the non-front of backlight.

According to this example embodiment, by assigning a priority level to driving environment information to be provided, it is possible to skip evaluation at a low danger level when evaluation at a high danger level is cleared, thereby performing evaluation more efficiently.

Fourth Example Embodiment

An information processing apparatus according to the fourth example embodiment of the present invention will be described next. The information processing apparatus according to this example embodiment is different from those according to the above-described second and third example embodiments in that artificial intelligence is evaluated with a plurality of evaluation indices (axes). The remaining components and operations are similar to those in the second and third example embodiments. Hence, the same reference numerals denote similar components and operations, and a detailed description thereof will be omitted.

Note that as a final evaluation, the comprehensive performance of artificial intelligence is obtained by combining evaluations with a plurality of evaluation indices. The plurality of evaluation indices include safety and stability indicating comfort. The stability indicating comfort includes the stability of the speed, the linearity of the vehicle movement, and the turning angle of the vehicle at a curve. The evaluation results obtained with the plurality of evaluation indices may be output, respectively.
<<Overview of Artificial Intelligence Evaluation>>

Figure 16:
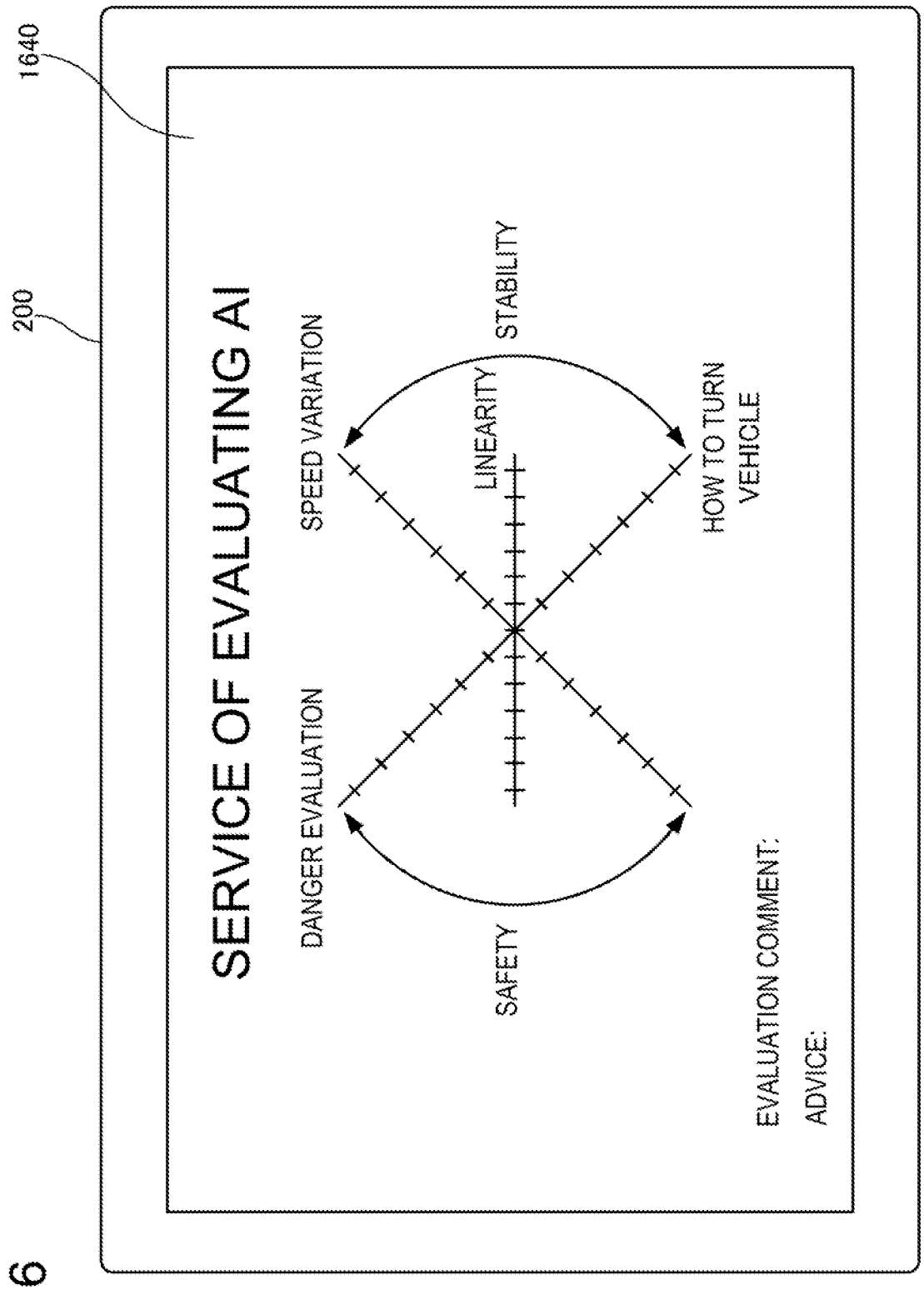
FIG. 16 is a view showing an overview of artificial intelligence evaluation according to the fourth example embodiment of the present invention.

FIG. 16 is a view showing an overview of artificial intelligence evaluation according to this example embodiment.

Referring to FIG. 16, AI processing is evaluated with a plurality of evaluation indices (axes). For example, an evaluation result notification screen 1640 shown in FIG. 16 roughly shows two evaluation indices of "safety" and "stability". Furthermore, "stability" includes, as negative components, "speed variation (small fluctuations in speed)", "non-linearity (the left and right shaking when driving straight)", and "how to turn vehicle badly (sharp turn at curve or corner)".
<<Functional Arrangement of Information Processing Apparatus>>

Figure 17:
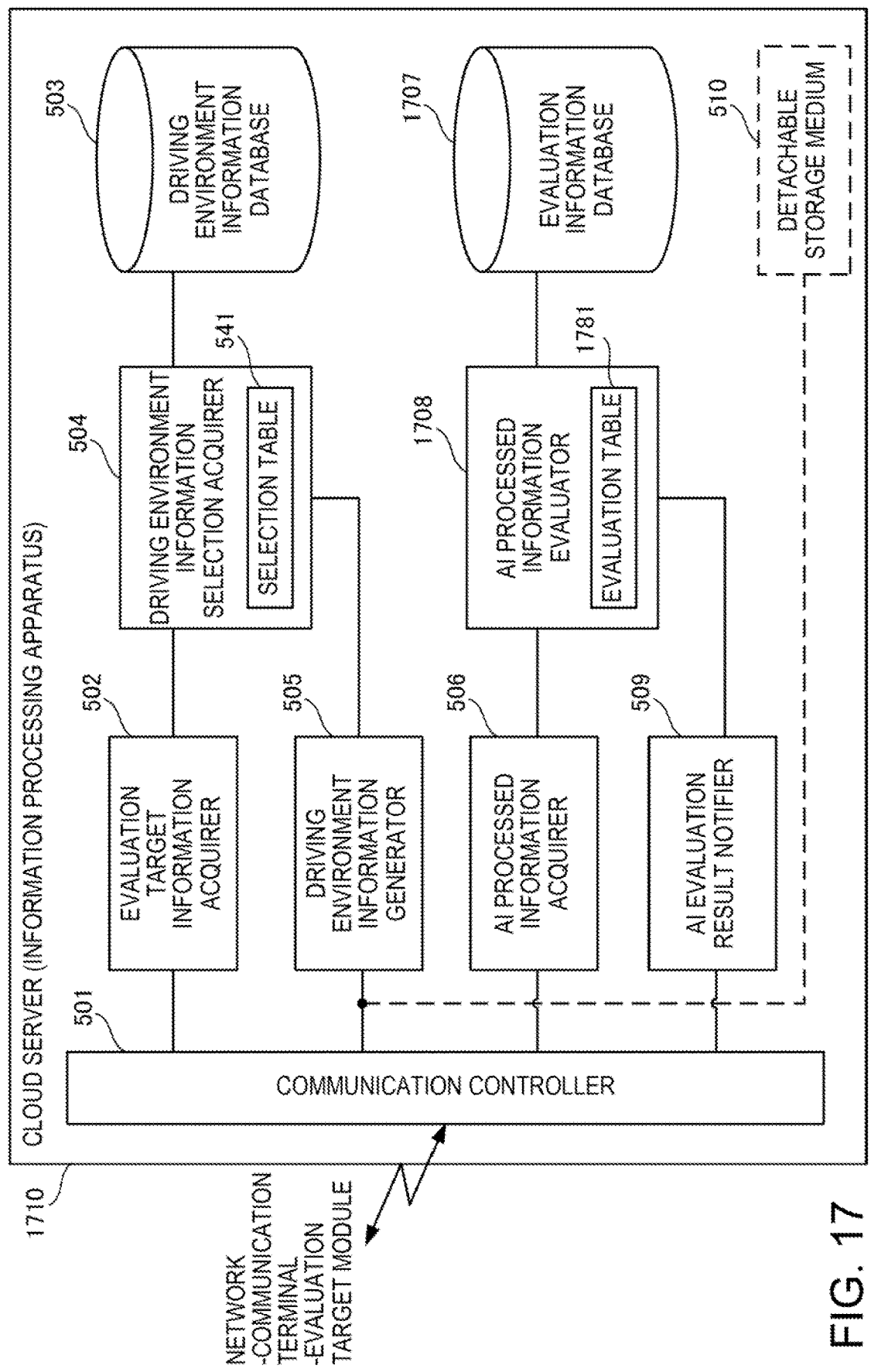
FIG. 17 is a block diagram showing the functional arrangement of an information processing apparatus serving as a cloud server according to the fourth example embodiment of the present invention.

FIG. 17 is a block diagram showing the functional arrangement of an information processing apparatus 1710 serving as a cloud server according to this example embodiment. Note that in FIG. 17, the same reference numerals as in FIG. 5 denote similar components and a repetitive description thereof will be omitted.

The information processing apparatus 1710 shown in FIG. 17 includes an evaluation information database 1707 and an AI processed information evaluator 1708 including an evaluation table 1781. The evaluation information database 1707 holds evaluation information for each of a plurality of evaluation indices (axes) in correspondence with one piece of driving environment information. Note that the AI processed information evaluator 1708 is changed since the evaluation information database 1707 is changed. However, function of the AI processed information evaluator 1708 is not essentially changed, and therefore, a description thereof will be omitted.

(Evaluation Index Table)

FIG. 18 is a table showing the structure of an evaluation index table 1810 according to this example embodiment. The evaluation index table 1810 is a table that summarizes a plurality of evaluation indices (axes) used in this example embodiment.

The evaluation index table 1810 includes "safety" and "stability" as comprehensive evaluation axes 1811, and includes, as individual evaluation axes 1812, "danger state", "accident", and the like included in "safety" and "speed variation", "linearity", "how to turn vehicle", and the like included in "stability". The present invention, however, is not limited to them. Note that "stability" is an axis associated with "comfort".

(Evaluation Information Database)

FIG. 19 is a table showing the structure of the evaluation information database 1707 according to this example embodiment. Note that in FIG. 19, the same reference numerals as in FIG. 8 denote similar components and a repetitive description thereof will be omitted.

The evaluation information database 1707 holds evaluation information 1912 of the first evaluation axis to evaluation information 1913 of the nth evaluation axis. Note that contents of the evaluation information 1912 of the first evaluation axis to the evaluation information 1913 of the nth evaluation axis are the same as those of the evaluation information 802 of FIG. 8. However, the kind or value of evaluation information may be different for each evaluation axis and an evaluation condition 803 may be different for each evaluation axis.

(Evaluation Table)

Figure 20:
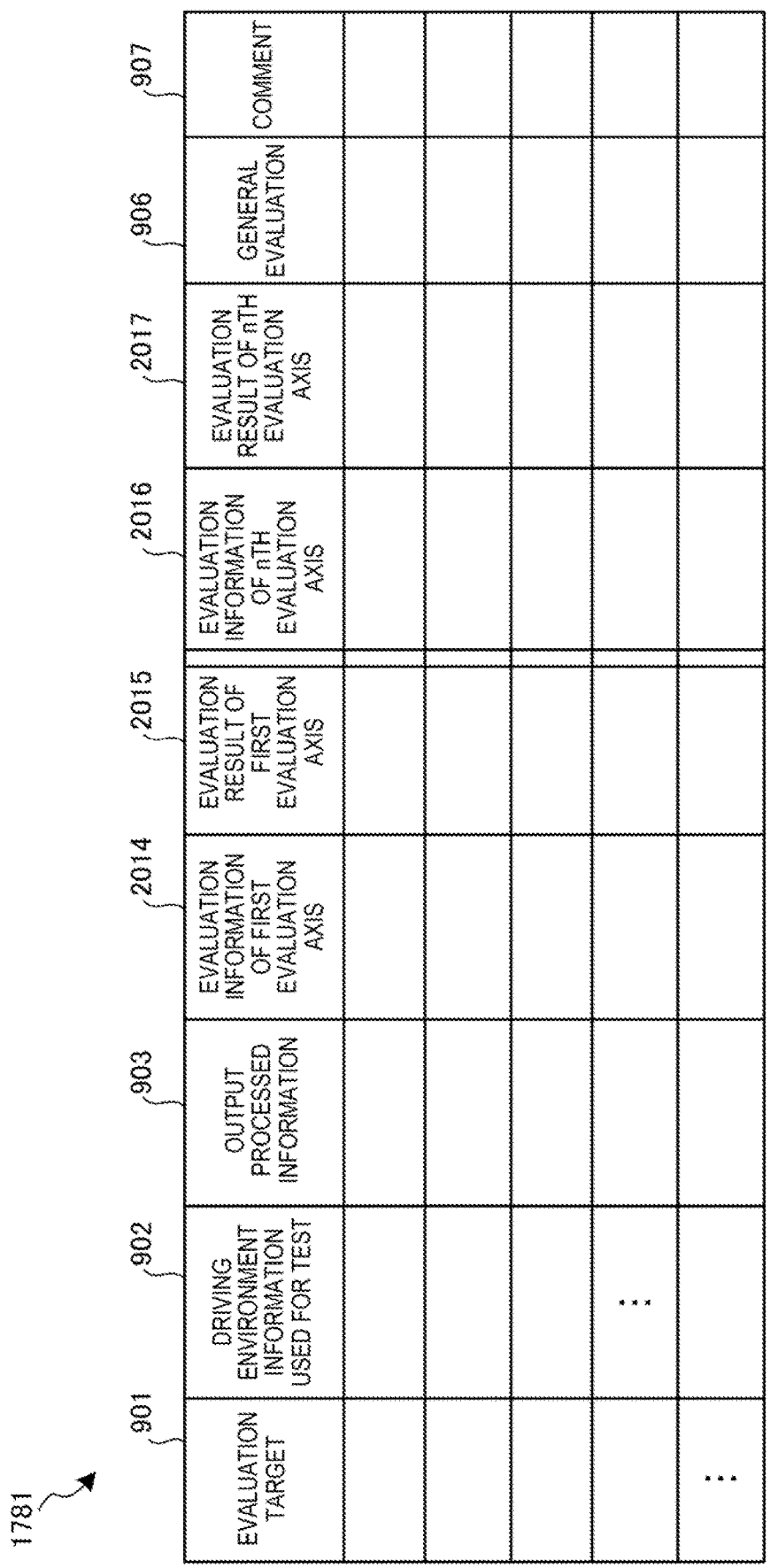
FIG. 20 is a table showing the structure of an evaluation table according to the fourth example embodiment of the present invention.

FIG. 20 is a table showing the structure of the evaluation table 1781 according to this example embodiment. Note that in FIG. 20, the same reference numerals as in FIG. 9 denote similar components and a repetitive description thereof will be omitted.

The evaluation table 1781 stores evaluation information 2014 of the first evaluation axis, an evaluation result 2015 of the first evaluation axis, . . . , evaluation information 2016 of the nth evaluation axis, and an evaluation result 2017 of the nth evaluation axis.

<<Processing Procedure of Information Processing Apparatus>>

Figure 21:
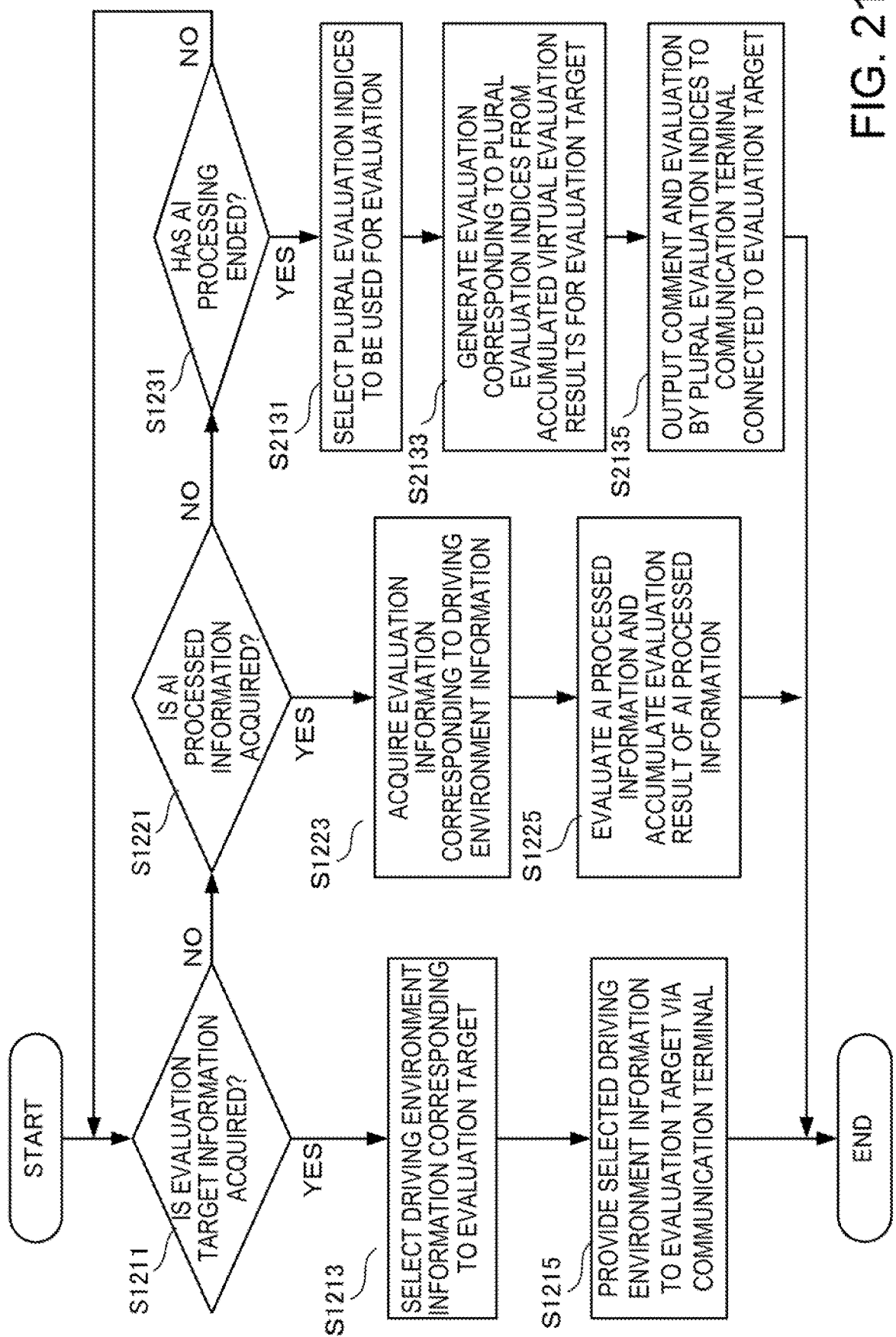
FIG. 21 is a flowchart illustrating the processing procedure of the information processing apparatus serving as the cloud server according to the fourth example embodiment of the present invention.

FIG. 21 is a flowchart illustrating the processing procedure of the information processing apparatus 1710 serving as the cloud server according to this example embodiment. Note that in FIG. 21, the same step numbers as in FIG. 12 denote the same steps and a repetitive description thereof will be omitted.

If it is determined in step S1231 that AI processing has ended, the information processing apparatus 1710 selects, in step S2131, a plurality of evaluation indices to be used for evaluation. In step S2133, the information processing apparatus 1710 generates an evaluation corresponding to the plurality of evaluation indices from accumulated virtual evaluation results for an evaluation target. In step S2135, the information processing apparatus 1710 outputs a comment and the evaluation by the plurality of evaluation indices to a communication terminal connected to the evaluation target.

According to this example embodiment, it is possible to perform multi-axial artificial intelligence evaluation with a plurality of evaluation indices, thereby performing fine or delicate evaluation including the strength and weakness of artificial intelligence.

Fifth Example Embodiment

An information processing apparatus according to the fifth example embodiment of the present invention will be described next. The information processing apparatus according to this example embodiment is different from those according to the above-described second to fourth example embodiments in that evaluation is performed by comparing virtual vehicle information executed in an evaluation target vehicle with virtual vehicle information executed in a model vehicle. That is, in this example embodiment, the performance of artificial intelligence is evaluated by comparing the result of virtual automated driving by artificial intelligence with the driving result of a model vehicle. The remaining components and operations are similar to those in the second example embodiment. Hence, the same reference numerals denote similar components and operations, and a detailed description thereof will be omitted.

<<Functional Arrangement of Information Processing Apparatus>>

Figure 22:
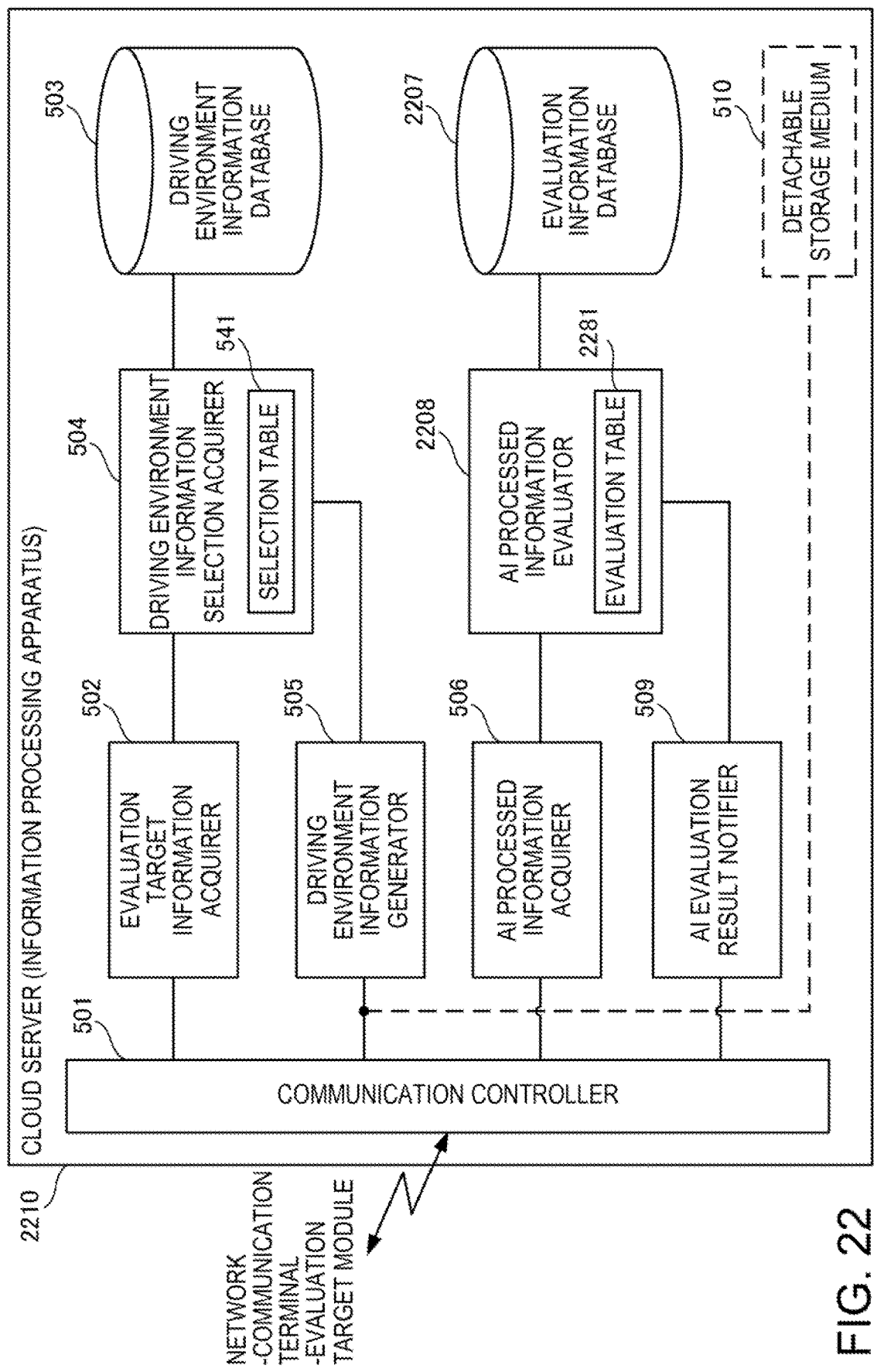
FIG. 22 is a block diagram showing the functional arrangement of an information processing apparatus serving as a cloud server according to the fifth example embodiment of the present invention.

FIG. 22 is a block diagram showing the functional arrangement of an information processing apparatus 2210 serving as a cloud server according to this example embodiment. Note that in FIG. 22, the same reference numerals as in FIG. 5 denote similar components and a repetitive description thereof will be omitted.

The information processing apparatus 2210 shown in FIG. 22 includes an evaluation information database 2207 and an AI processed information evaluator 2208 including an evaluation table 2281. The evaluation information database 2207 holds evaluation information obtained from an evaluation target and evaluation information obtained from a model vehicle, under the same driving environment information. Note that the evaluation table 2281 and the AI processed information evaluator 2208 are changed since the evaluation information database 2207 is changed. However, functions of the evaluation table 2281 and the AI processed information evaluator 2208 are not essentially changed, and therefore, a description thereof will be omitted.

<<Processing Procedure of Information Processing Apparatus>>

Figure 23:
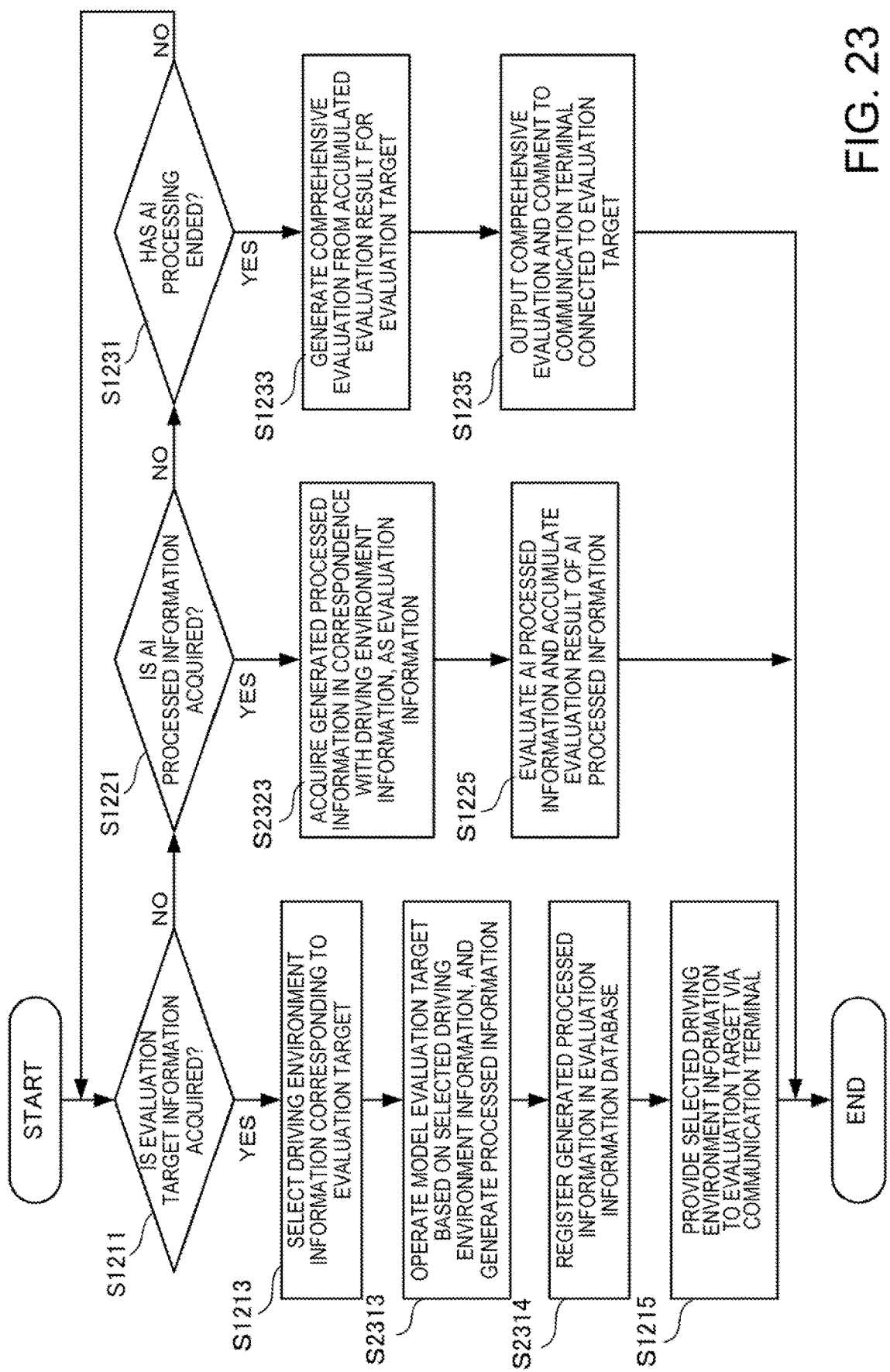
FIG. 23 is a flowchart illustrating the processing procedure of the information processing apparatus serving as the cloud server according to the fifth example embodiment of the present invention.

FIG. 23 is a flowchart illustrating the processing procedure of the information processing apparatus 2210 serving as the cloud server according to this example embodiment. Note that in FIG. 23, the same step numbers as in FIG. 12 denote the same steps and a repetitive description thereof will be omitted.

If it is determined in step S1211 that evaluation target information is acquired, the information processing apparatus 2210 operates, in step S2313, a model evaluation target based on selected driving environment information, and generates processed information. In step S2314, the information processing apparatus 2210 registers the generated processed information as evaluation information in the evaluation information database 2207.

If it is determined in step S1221 that AI processed information is acquired, the information processing apparatus 2210 acquires, in step S2323, in correspondence with the driving environment information, the processed information generated in step S2313 and registered in the evaluation information database 2207.

According to this example embodiment, since a virtual driving result of a model virtual vehicle is used as an evaluation criterion, it is possible to ensure the stability and the correctness of evaluation of artificial intelligence.

Sixth Example Embodiment

An information processing apparatus according to the sixth example embodiment of the present invention will be described next. The information processing apparatus according to this example embodiment is different from those according to the above-described second to fifth example embodiments in that a proposer proposes replacement of AI in consideration of an evaluation result from the information processing apparatus. The remaining components and operations are similar to those in the second example embodiment. Hence, the same reference numerals denote similar components and operations, and a detailed description thereof will be omitted.

<Overview of Artificial Intelligence Evaluation>>

Figure 24:
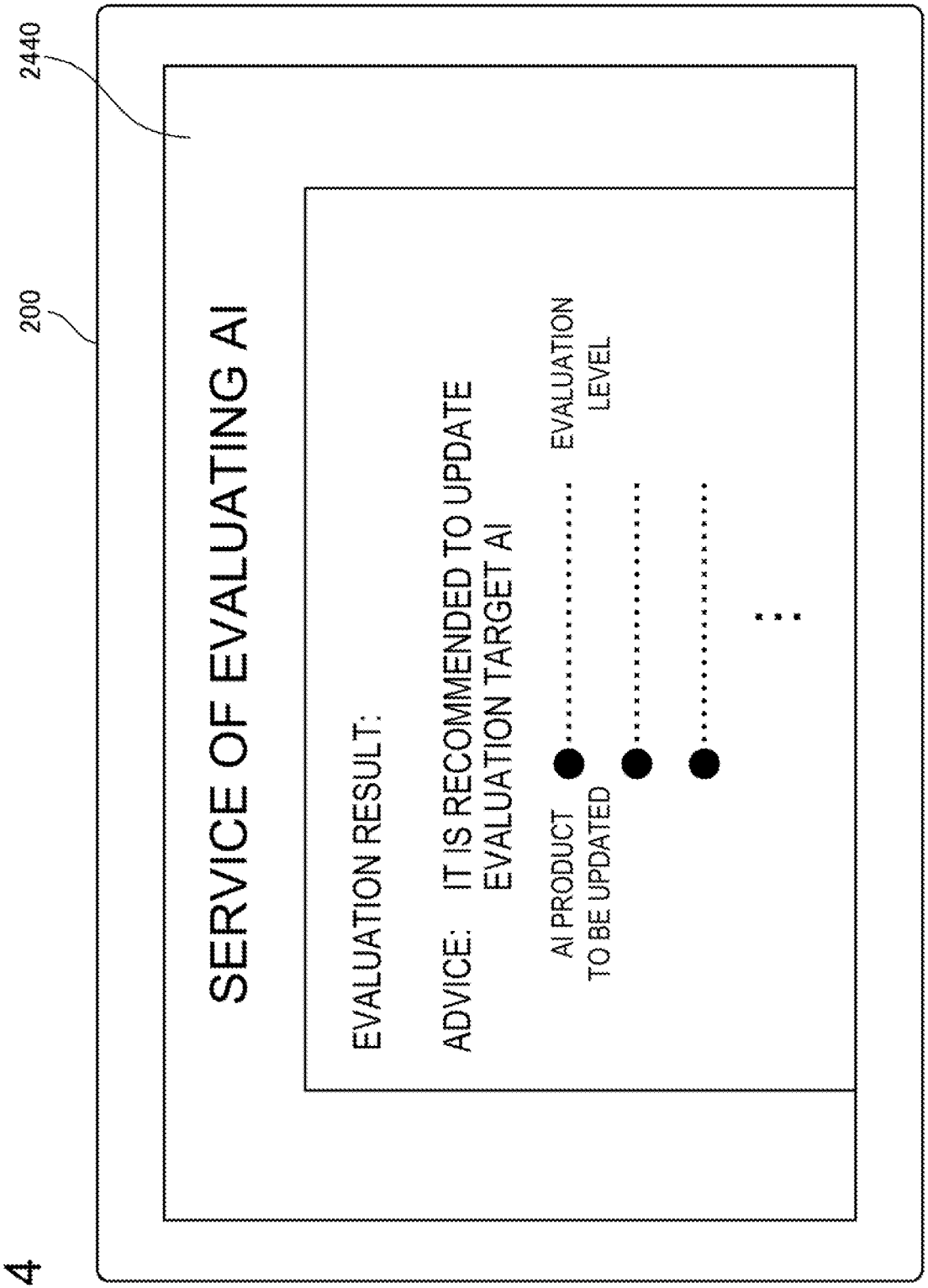
FIG. 24 is a view showing an overview of artificial intelligence evaluation according to the sixth example embodiment of the present invention.

FIG. 24 is a view showing an overview of artificial intelligence evaluation according to this example embodiment.

Referring to FIG. 24, on an evaluation result notification screen 2440, it is recommended to update an evaluation target AI together with notification of an evaluation result.

<<Processing Procedure of Information Processing Apparatus>>

Figure 25:
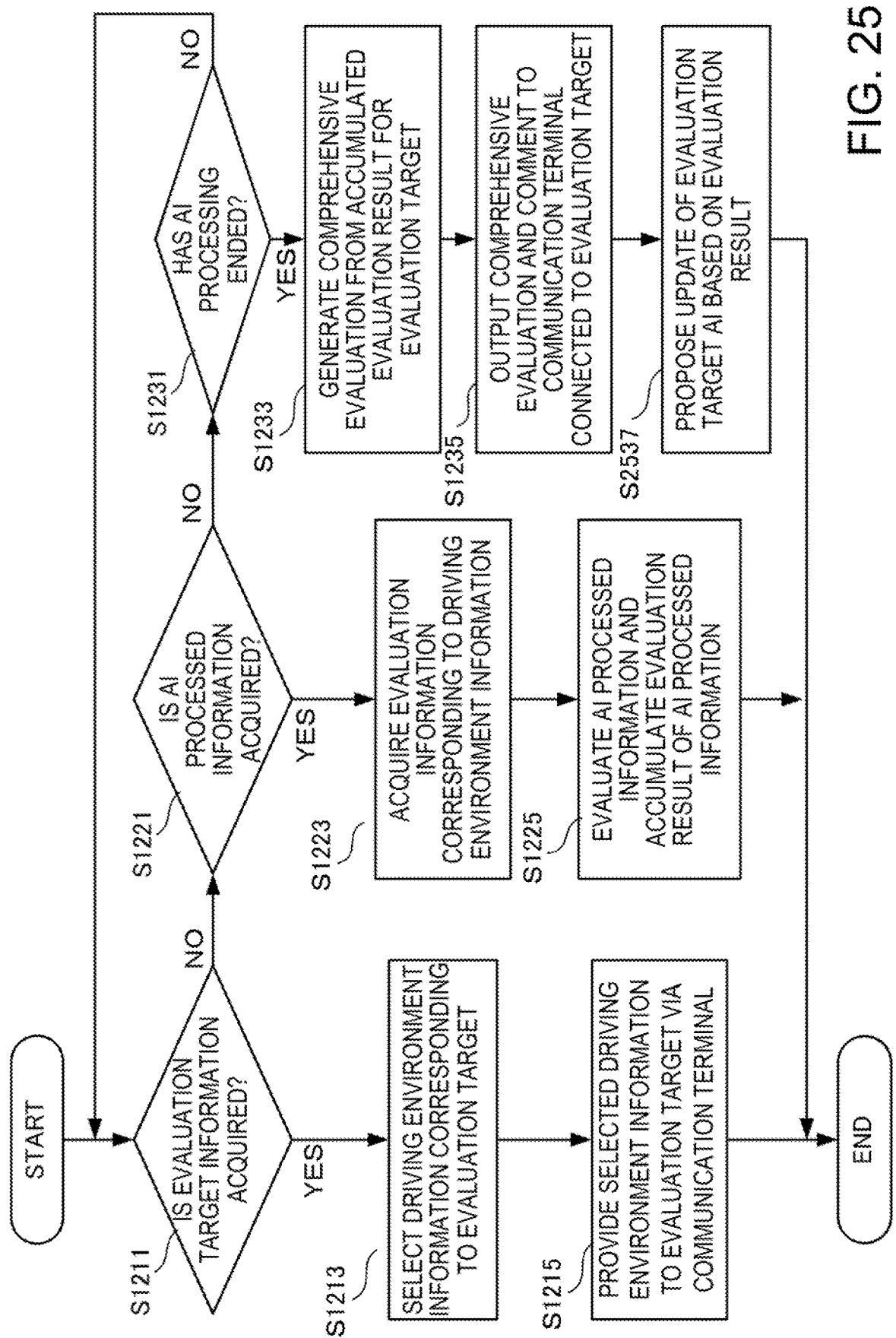
FIG. 25 is a flowchart illustrating the processing procedure of an information processing apparatus serving as a cloud server according to the sixth example embodiment of the present invention.

FIG. 25 is a flowchart illustrating the processing procedure of an information processing apparatus 2510 (not shown) serving as a cloud server according to this example embodiment. Note that in FIG. 25, the same step numbers as in FIG. 12 denote the same steps and a repetitive description thereof will be omitted.

In step S2537, the information processing apparatus 2510 proposes update of an evaluation target AI based on an evaluation result. Note that a proposal by the proposer based on the evaluation result may be upgrading or the like.

According to this example embodiment, it is possible to provide a more improved driving environment to the users who enjoy automated driving vehicles.

Seventh Example Embodiment

An information processing apparatus according to the seventh example embodiment of the present invention will be described next. The information processing apparatus according to this example embodiment is different from those according to the above-described second to sixth example embodiments in that the information processing apparatus tests and evaluates AI. The remaining components and operations are similar to those in the second to sixth example embodiments. Hence, the same reference numerals denote similar components and operations, and a detailed description thereof will be omitted.

<<Operation Procedure of Information Processing System>>

Figure 26:
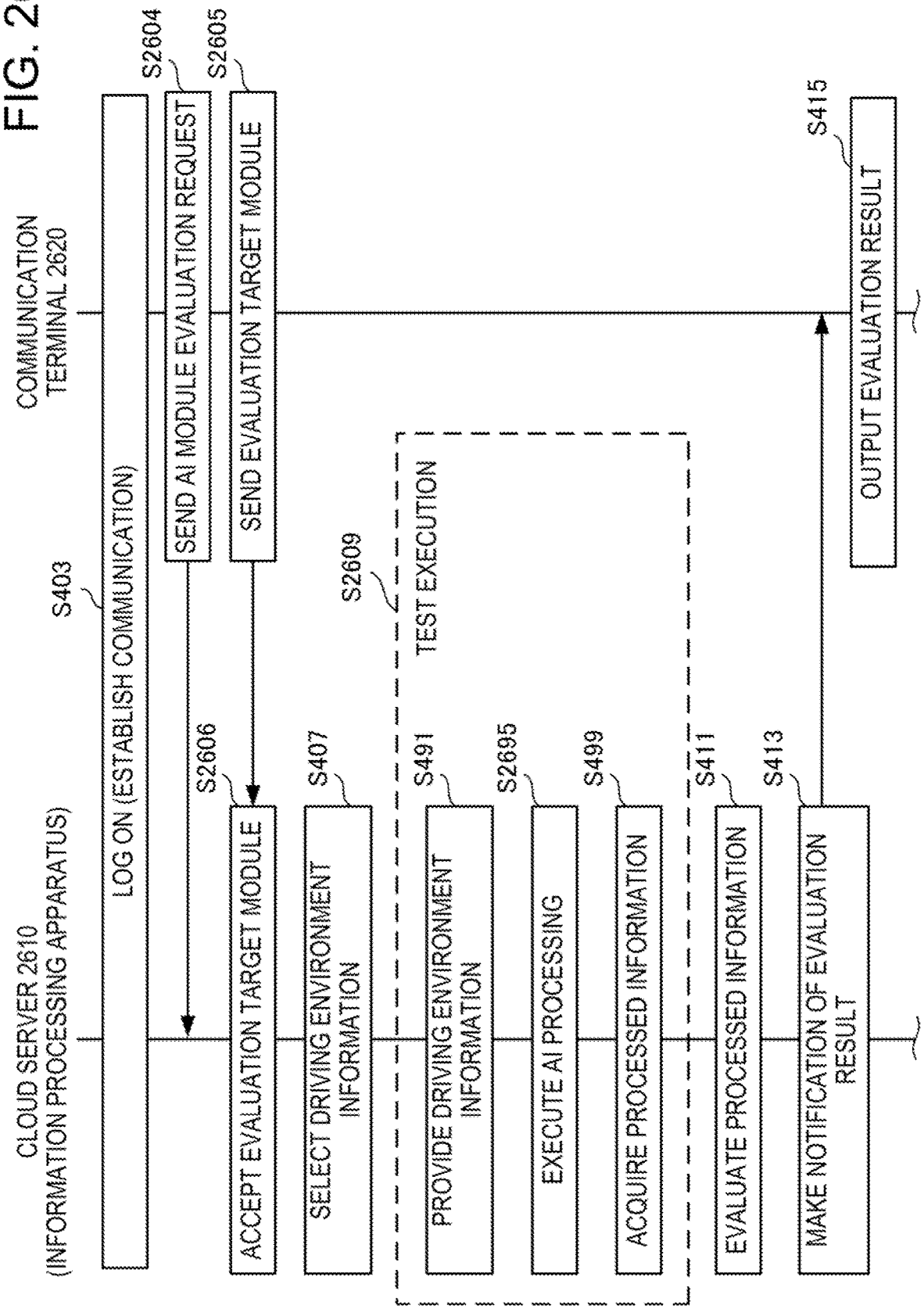
FIG. 26 is a sequence chart showing the operation procedure of an information processing system including an information processing apparatus according to the seventh example embodiment of the present invention.

FIG. 26 is a sequence chart showing the operation procedure of an information processing system including the information processing apparatus according to this example embodiment. Note that in FIG. 26, the same step numbers as in FIG. 4 denote the same steps and a repetitive description thereof will be omitted.

In step S2604, a communication terminal 2620 sends an AI module evaluation request to an information processing apparatus 2610. In step S2605, the communication terminal 2620 confidentially sends an evaluation target module to the information processing apparatus 2610. In step S2606, the information processing apparatus 2610 accepts a test and evaluation of the sent evaluation target module.

In test execution in step S2609, the information processing apparatus 2610 executes, in step S2695, AI processing using driving environment information selected in correspondence with the evaluation target module.

According to this example embodiment, it is possible to fairly evaluate, under the common condition, artificial intelligence for performing the same function.

Eighth Example Embodiment

An information processing apparatus according to the eighth example embodiment of the present invention will be described next. The information processing apparatus according to this example embodiment is different from those according to the above-described second to seventh example embodiments in that AI is connected to the information processing apparatus serving as a virtual driving simulation game machine and is evaluated. The remaining components and operations are similar to those in the second to sixth example embodiments. Hence, the same reference numerals denote similar components and operations, and a detailed description thereof will be omitted.

<<Arrangement of Information Processing Apparatus>>

Figure 27:
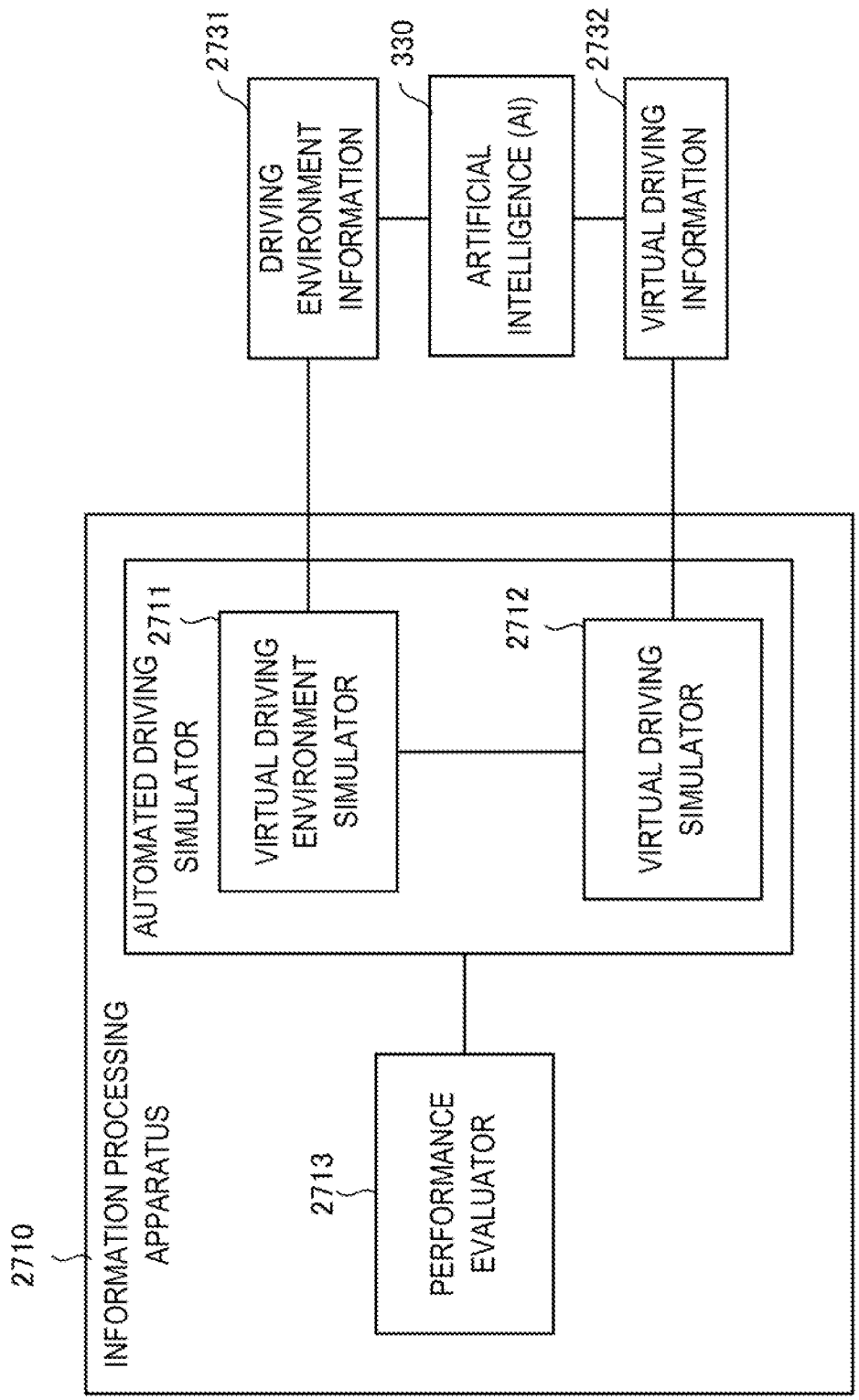
FIG. 27 is a block diagram showing the arrangement of an information processing apparatus according to the eighth example embodiment of the present invention.

FIG. 27 is a block diagram showing the arrangement of an information processing apparatus 2710 according to this example embodiment.

In the information processing apparatus 2710, a virtual driving environment simulator 2711 and a virtual driving simulator 2712 are connected to each other to function as a virtual automated driving simulator. Artificial intelligence (AI) 330 acquires driving environment information from the virtual driving environment simulator 2711, and outputs virtual driving information to the virtual driving simulator 2712. The virtual driving environment simulator 2711 and the virtual driving simulator 2712 operate as if the artificial intelligence (AI) 330 were a game user and the automated driving simulator were a game machine. A performance evaluator 2713 evaluates the virtual automated driving capability of the artificial intelligence (AI) 330 based on information from the automated driving simulator.

According to this example embodiment, it is possible to more efficiently and more fairly evaluate standardized artificial intelligence (AI) for automated driving.

Other Example Embodiments

While the invention has been particularly shown and described with reference to example embodiments thereof, the invention is not limited to these example embodiments. It will be understood by those of ordinary skill in the art that various changes in form and details may be made therein without departing from the spirit and scope of the present invention as defined by the claims. A system or apparatus including any combination of the individual features included in the respective example embodiments may be incorporated in the scope of the present invention.

The present invention is applicable to a system including a plurality of devices or a single apparatus. The present invention is also applicable even when an information processing program for implementing the functions of example embodiments is supplied to the system or apparatus directly or from a remote site. Hence, the present invention also incorporates the program installed in a computer to implement the functions of the present invention by the computer, a medium storing the program, and a WWW (World Wide Web) server that causes a user to download the program. Especially, the present invention incorporates at least a non-transitory computer readable medium storing a program that causes a computer to execute processing steps included in the above-described example embodiments.

Other Expressions of Example Embodiments

Some or all of the above-described example embodiments can also be described as in the following supplementary notes but are not limited to the followings.

(Supplementary Note 1)

There is provided an information processing apparatus comprising:
- a generator that generates, from driving environment information generated by a driving environment simulator that simulates virtual driving environments of a virtual vehicle, driving environment information representing a virtual driving environment in which the virtual vehicle is readily put in a dangerous state and to be provided to artificial intelligence for performing virtual automated driving of the virtual vehicle;
- an acquirer that acquires a virtual driving result obtained by performing the virtual automated driving of the virtual vehicle by the artificial intelligence in the virtual driving environment; and
- an evaluator that evaluates performance of the artificial intelligence from the virtual driving result of the virtual automated driving by the artificial intelligence.

(Supplementary Note 2)

There is provided the information processing apparatus according to supplementary note 1, wherein said generator generates the driving environment information in order from driving environment information representing a virtual driving environment in which the virtual vehicle is readily put in the dangerous state to driving environment information representing a virtual driving environment in which the virtual vehicle is hardly put in the dangerous state.

(Supplementary Note 3)

There is provided the information processing apparatus according to supplementary note 2, wherein the driving environment information representing the virtual driving environment in which the virtual vehicle is readily put in the dangerous state includes driving environment information representing situations that deviate from normal driving rules.

(Supplementary Note 4)

There is provided the information processing apparatus according to supplementary note 2 or 3, wherein said generator does not generate driving environment information representing a virtual driving environment in which a degree to which the virtual vehicle puts in the dangerous state exceeds a threshold.

(Supplementary Note 5)

There is provided the information processing apparatus according to any one of supplementary notes 1 to 4, wherein the driving environment information includes video data captured by a front camera representing the virtual driving environment of the virtual vehicle.

(Supplementary Note 6)

There is provided the information processing apparatus according to any one of supplementary notes 1 to 5, wherein said evaluator evaluates performances of the artificial intelligence by a plurality of evaluation indices.

(Supplementary Note 7)

There is provided the information processing apparatus according to supplementary note 6, wherein said evaluator determines comprehensive performance of the artificial intelligence by combining the performances by the plurality of evaluation indices.

(Supplementary Note 8)

There is provided the information processing apparatus according to supplementary note 7, wherein the plurality of evaluation indices include at least safety and stability indicating comfort.

(Supplementary Note 9)

There is provided the information processing apparatus according to supplementary note 8, wherein the stability indicating comfort includes stability of speed, linearity of virtual vehicle movement, and a turning angle of virtual vehicle at a curve.

(Supplementary Note 10)

There is provided the information processing apparatus according to supplementary note 6, wherein said evaluator evaluates the performance of the artificial intelligence by comparing a driving result of the virtual automated driving by the artificial intelligence with a model driving result of a virtual model vehicle.

(Supplementary Note 11)

There is provided the information processing apparatus according to any one of supplementary notes 1 to 10, wherein said evaluator evaluates the performance of the artificial intelligence by comparing a driving result of the virtual automated driving by the artificial intelligence with a model driving result of a virtual model vehicle.

(Supplementary Note 12)

There is provided the information processing apparatus according to any one of supplementary notes 1 to 11, wherein
- said generator generates driving environment information for evaluating a specific function included in the artificial intelligence, and
- said evaluator evaluates performance of the specific function.

(Supplementary Note 13)

There is provided the information processing apparatus according to any one of supplementary notes 1 to 12, further comprising a proposer that proposes update of the artificial intelligence in consideration of the evaluation result of said evaluator.

(Supplementary Note 14)

There is provided an information processing method comprising:
- generating, from driving environment information generated by a driving environment simulator that simulates virtual driving environments of a virtual vehicle, driving environment information representing a driving environment in which the virtual vehicle is readily put in a dangerous state and to be provided to artificial intelligence for performing virtual automated driving of the virtual vehicle;

acquiring a virtual driving result obtained by performing the virtual automated driving of the virtual vehicle by the artificial intelligence in the virtual driving environment; and evaluating performance of the artificial intelligence from the virtual driving result of the virtual automated driving by the artificial intelligence.

(Supplementary Note 15)

There is provided an information processing program for causing a computer to execute a method, comprising:

generating, from driving environment information generated by a driving environment simulator that simulates virtual driving environments of a virtual vehicle, driving environment information representing a driving environment in which the virtual vehicle is readily put in a dangerous state and to be provided to artificial intelligence for performing virtual automated driving of the virtual vehicle;

acquiring a virtual driving result obtained by performing the virtual automated driving of the virtual vehicle by the artificial intelligence in the virtual driving environment; and evaluating performance of the artificial intelligence from the virtual driving result of the virtual automated driving by the artificial intelligence.

What is claimed is:

1. An information processing apparatus comprising:
at least one memory storing instructions; and
at least one processor configured to execute the instructions to:
provide an e artificial intelligence for performing virtual automated driving of the virtual vehicle with driving environment information generated by a driving environment simulator that simulates virtual driving environments of a virtual vehicle;
acquire a virtual driving result output from the artificial intelligence performing the virtual automated driving of the virtual vehicle in the virtual driving environment; and
evaluate performance of the artificial intelligence from the virtual driving result,
store the virtual driving environment and a danger level of the virtual driving environment.

2. The information processing apparatus according to claim 1, wherein the at least one processor is further configured to generate the driving environment information in order from driving environment information representing a virtual driving environment in which the virtual vehicle is readily put in the dangerous state to driving environment information representing a virtual driving environment in which the virtual vehicle is hardly put in the dangerous state.

3. The information processing apparatus according to claim 2, wherein the driving environment information representing the virtual driving environment in which the virtual vehicle is readily put in the dangerous state includes driving environment information representing situations that deviate from normal driving rules.

4. The information processing apparatus according to claim 2, wherein the at least one processor is further configured to not generate driving environment information representing a virtual driving environment in which a degree to which the virtual vehicle puts in the dangerous state exceeds a threshold.

5. The information processing apparatus according to claim 1, wherein the driving environment information includes video data captured by a front camera representing the virtual driving environment of the virtual vehicle.

6. The information processing apparatus according to claim 1, wherein the at least one processor is further configured to evaluate performances of the artificial intelligence by a plurality of evaluation indices.

7. The information processing apparatus according to claim 6, wherein the at least one processor is further configured to determine comprehensive performance of the artificial intelligence by combining the performances by the plurality of evaluation indices.

8. The information processing apparatus according to claim 7, wherein the plurality of evaluation indices include at least safety and stability indicating comfort.

9. The information processing apparatus according to claim 8, wherein the stability indicating comfort includes stability of speed, linearity of virtual vehicle movement, and a turning angle of virtual vehicle at a curve.

10. The information processing apparatus according to claim 6, wherein the at least one processor is further configured to output evaluation results obtained by the plurality of evaluation indices, respectively.

11. The information processing apparatus according to claim 1, wherein the at least one processor is further configured to evaluate the performance of the artificial intelligence by comparing a driving result of the virtual automated driving by the artificial intelligence with a model driving result of a virtual model vehicle.

12. The information processing apparatus according to claim 1, wherein
the at least one processor is further configured to generate driving environment information for evaluating a specific function included in the artificial intelligence, and
the at least one processor is further configured to evaluate performance of the specific function.

13. The information processing apparatus according to claim 1, wherein the at least one processor is further configured to propose an update of the artificial intelligence in consideration of the evaluation result of said evaluator.

14. An information processing method comprising:
providing an e artificial intelligence for performing virtual automated driving of the virtual vehicle with from driving environment information generated by a driving environment simulator that simulates virtual driving environments of a virtual vehicle;
acquiring a virtual driving result output from the artificial intelligence performing the virtual automated driving of the virtual vehicle in the virtual driving environment;
evaluating performance of the artificial intelligence from the virtual driving result; and
storing the virtual driving environment and a danger level of the virtual driving environment.

15. A non-transitory computer-readable storage medium storing an information processing program for causing a computer to execute a method, comprising:
providing an e artificial intelligence for performing virtual automated driving of the virtual vehicle with driving environment information generated by a driving environment simulator that simulates virtual driving environments of a virtual vehicle;
acquiring a virtual driving result output from the artificial intelligence performing the virtual automated driving of the virtual vehicle in the virtual driving environment;
evaluating performance of the artificial intelligence from the virtual driving result; and
storing the virtual driving environment and a danger level of the virtual driving environment.

16. The information processing apparatus according to claim 1, wherein if it is evaluated that a performance of the artificial intelligence does not reach a predetermined level, the virtual driving environments corresponding to the lower danger rank is provided,
   wherein if it is evaluated that a performance of the artificial intelligence reaches the predetermined level, the virtual driving environments corresponding to the lower danger rank is skipped.

* * * * *